United States Patent
Lee et al.

(10) Patent No.: US 10,332,467 B2
(45) Date of Patent: Jun. 25, 2019

(54) DISPLAY DEVICE AND A METHOD FOR DRIVING SAME

(71) Applicant: LG DISPLAY CO., LTD., Seoul (KR)

(72) Inventors: Bo Sun Lee, Cheongju-s (KR); Hun Jeoung, Paju-si (KR); Sang Hee Yu, Paju-si (KR); Sung Hyun Cho, Seoul (KR); Sung Wook Chang, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 85 days.

(21) Appl. No.: 15/125,468

(22) PCT Filed: Mar. 10, 2015

(86) PCT No.: PCT/KR2015/002314
§ 371 (c)(1),
(2) Date: Sep. 12, 2016

(87) PCT Pub. No.: WO2015/137710
PCT Pub. Date: Sep. 17, 2015

(65) Prior Publication Data
US 2017/0076683 A1  Mar. 16, 2017

Related U.S. Application Data

(60) Provisional application No. 61/950,734, filed on Mar. 10, 2014.

(51) Int. Cl.
*G09G 3/3266* (2016.01)
*G09G 3/36* (2006.01)
(Continued)

(52) U.S. Cl.
CPC ......... *G09G 3/3677* (2013.01); *G06F 3/0416* (2013.01); *G09G 3/3266* (2013.01); *G09G 3/3688* (2013.01); *G09G 3/3696* (2013.01); *G11C 19/28* (2013.01); *G09G 3/20* (2013.01); *G09G 2300/0809* (2013.01); *G09G 2310/0213* (2013.01); *G09G 2310/0248* (2013.01);
(Continued)

(58) Field of Classification Search
CPC .. G09G 3/3677; G09G 3/3674; G09G 3/3681; G09G 3/3266; G09G 3/3696
See application file for complete search history.

(56) References Cited

U.S. PATENT DOCUMENTS

2001/0017611 A1    8/2001  Moriyama
2002/0175887 A1*  11/2002  Yamazaki ............... G09G 3/20
                                                         345/87
(Continued)

FOREIGN PATENT DOCUMENTS

KR    10-2001-0085723 A    9/2001
KR    10-2007-0028727 A    3/2007
(Continued)

*Primary Examiner* — Alexander Eisen
*Assistant Examiner* — Cory A Almeida
(74) *Attorney, Agent, or Firm* — Birch, Stewart, Kolasch & Birch, LLP

(57) ABSTRACT

Present invention relates to a display device and a driving method thereof. In particular, the present invention is to provide a display device and a driving method thereof, which block at least one of scan signals output from gate lines according to an enable signal.

19 Claims, 19 Drawing Sheets

(51) Int. Cl.
    *G11C 19/28*     (2006.01)
    *G06F 3/041*     (2006.01)
    *G09G 3/20*      (2006.01)

(52) U.S. Cl.
    CPC ............ *G09G 2310/0267* (2013.01); *G09G 2310/0286* (2013.01); *G09G 2310/04* (2013.01); *G09G 2330/021* (2013.01); *G09G 2340/0442* (2013.01); *G09G 2340/0471* (2013.01); *G09G 2354/00* (2013.01)

(56) References Cited

U.S. PATENT DOCUMENTS

| | | | |
|---|---|---|---|
| 2005/0179677 A1* | 8/2005 | Nojiri | G09G 3/3614 |
| | | | 345/204 |
| 2008/0002803 A1* | 1/2008 | Kim | G09G 3/006 |
| | | | 377/64 |
| 2008/0055225 A1 | 3/2008 | Pak et al. | |
| 2013/0293529 A1 | 11/2013 | You et al. | |

FOREIGN PATENT DOCUMENTS

| | | |
|---|---|---|
| KR | 10-2008-0020876 A | 3/2008 |
| KR | 10-2008-0060824 A | 7/2008 |
| KR | 10-2013-0056410 A | 5/2013 |
| KR | 1020130062011 A | 6/2013 |
| KR | 1020140014731 A | 2/2014 |

* cited by examiner

DISPLAY DEVICE AND A METHOD FOR DRIVING SAME

CROSS-REFERENCED TO RELATED APPLICATIONS

This application is the National Phase of PCT International Application No. PCT/KR2015/002314, filed on Mar. 10, 2015, which claims priority under 35 U.S.C. 119(e) to U.S. Provisional Application No. 61/950,734, filed on Mar. 10, 2014. All of which are hereby expressly incorporated by reference into the present application.

BACKGROUND OF THE INVENTION

Field of the Invention

The present invention relates to a display device, and particularly, to a display device and a driving method thereof, which decrease consumption power.

Description of the Related Art

A flat panel display (FPD) device is applied to various kinds of electronic devices such as portable phones, tablet personal computers (PCs), notebook computers, etc. Examples of the FPD device include liquid crystal display (LCD) devices, plasma display panels (PDPs), organic light emitting display devices, electrophoretic display (EPD) devices, etc.

In such FPD devices (hereinafter simply referred to as a display device), the LCD devices are devices that display an image by using the optical anisotropy of liquid crystal. The LCD devices have good features such as thinness, lightness, low consumption power, high image quality, etc., and thus are being widely used. The organic light emitting display devices, which use a self-emitting device self-emitting light and thus do not need a separate backlight, have a fast response time, high emission efficiency, high luminance, and a wide viewing angle. Therefore, the organic light emitting display devices are attracting much attention as the next-generation FPD devices.

Generally, the display device includes a panel for displaying an image, a gate driver for sequentially supplying a scan pulse to a plurality of gate lines provided in the panel, a data driver for supplying data voltages to a plurality of data lines provided in the panel, and a timing controller for controlling the gate driver and the data driver.

The gate driver drives a plurality of switching elements included in each of a plurality of pixels in an active matrix type, thereby displaying a dynamic image. The gate driver may be configured as an integrated circuit (IC) type and may be mounted on a panel or a film or may be directly provided in the panel in a gate-in panel (GIP) type. The gate driver may be provided separately from the panel where the pixels of the display device are arranged, and may be electrically connected to the panel. For example, the gate driver may be provided on a separate board in a chip-on flexible (COF) type, a chip-on glass (COG) type, or other various types and may be electrically connected to the panel.

The gate driver includes a shift register including a plurality of stages that sequentially output a scan signal to the gate lines provided in the panel in synchronization with a certain clock. In order to satisfy a smooth image output or other various driving conditions, the gate driver is driven according to a certain frequency and repeatedly performs an operation, which sequentially outputs a scan signal to the gate lines, at every frame.

SUMMARY OF THE INVENTION

In a display device displaying various kinds of images, in order to satisfy a temporary driving condition, a gate driver is always driven at a high frequency, or is driven in order for a scan signal to be sequentially output from all stages, causing the waste of consumption power.

Moreover, in a display device, since all the stages sequentially output the scan signal at the same frequency always, additional functions such as touch sensing or fingerprint recognition are restricted. The additional functions such as touch sensing or fingerprint recognition are easy to perform when the gate driver does not output the scan signal. Therefore, operations for the additional functions are performed for a blank time between two frames. In order to further secure a time for performing the additional functions, a period where an image is displayed in each frame period should be shortened. For this reason, a pixel charging time can be reduced, and an image quality defect such flicker can occur due to pixel coupling and noise which occur when each of the additional functions is performed.

To solve or address the technical problems described above and other limitations associated with the related art, there is provided a display device according to an embodiment of the present invention including a panel where a plurality of gate lines and a plurality of data line are provided; a data driver supplying data voltages to the plurality of data lines provided in the panel; and a gate driver including a plurality of stages sequentially driven according to a start signal, wherein the gate driver controls an output of a scan signal from at least one of the plurality of stages according to an enable signal.

To solve or address the technical problems described above and other limitations associated with the related art, there is provided another method of driving a display device including a step of outputting a scan signal to a gate line connected to at least one of a plurality of stages included in a gate driver according to an enable signal applied to the gate driver in one frame period; and a step of stopping an output of the scan signal to the gate line connected to the at least one of the plurality of stages according to the enable signal in the one frame period.

According to the embodiment(s) of the present invention, a panel may be driven in a method that blocks applying of a scan signal to some gate lines in one frame period to vary a period where pieces of data are charged into pixels provided in some driving areas. For example, according to the present invention, while an image corresponding to one frame period is being displayed, some stages may output the scan signal, and other some stages may not output the scan signal, thereby decreasing the waste of consumption power which occurs because pixels are recharged at an unnecessarily short period. Also, according to the present invention, while an image corresponding to one frame period is being displayed, some gate lines may block an output of the scan signal, and operations which are easy to perform in a period where there is no output of the scan signal may be performed.

In addition, a scan signal output period of each of some stages may vary differently from a scan signal output period of each of the other stages, thereby implementing a display device which is adaptive to various driving environments without being limited to a specific driving condition.

DETAILED DESCRIPTION OF THE EMBODIMENTS

Hereinafter, exemplary embodiments of the present invention will be described in detail with reference to the accompanying drawings.

In this disclosure below, embodiments will be described based on an LCD device, but are not limited thereto, and embodiments may be applied to all display devices, including a gate driver, such as organic light emitting display devices and the like.

Figure 1:
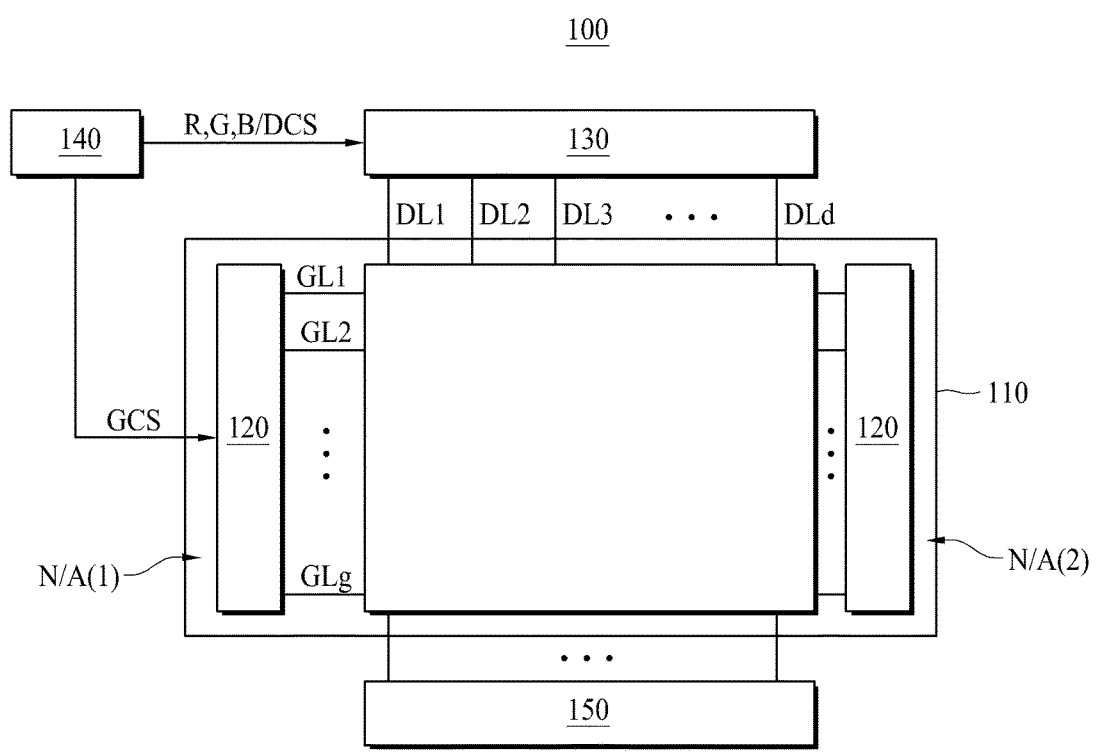
FIG. 1 is an exemplary diagram illustrating a configuration of a display device according to the present invention.

FIG. 1 is an exemplary diagram illustrating a configuration of a display device according to the present invention.

Referring to FIG. 1, a display device 100 includes a panel 110 that includes a display area A/A, where a plurality of pixels P are provided and display an image, and a non-display area N/A disposed outside the display area A/A. Also, the display device 100 includes a gate driver 120, which outputs a scan signal to the plurality of pixels P through a plurality of gate lines GL1 to GLg, and a data driver 130 that supplies data voltages to the plurality of pixels P through a plurality of data lines DL1 to DLd. The gate driver 120 and the data driver 130 may be included in the panel 110. Furthermore, signals for controlling the gate driver 120 and the data driver 130 may be supplied from a timing controller 140.

The panel 110 performs a function of displaying an image. The panel 110 may be changed depending on the kind of the display device 100. If the display device 100 according to the present invention is an LCD device, the panel 110 may be a liquid crystal panel where a liquid crystal layer is provided between two substrates. In this case, the plurality of data lines DL1 to DLd, the plurality of gate lines GL1 to GLg, and a plurality of thin film transistors (TFTs) electrically connected to the data lines DL1 to DLd and the gate lines GL1 to GLg to drive the pixels P are included in one of the substrates configuring the liquid crystal panel. The panel 110 includes a plurality of pixel electrodes for charging data voltages and a common electrode for driving liquid crystal filled into the liquid crystal layer along with the pixel electrodes.

As described above, the panel 110 may be configured with an organic light emitting panel. In this case, each of the pixels included in the panel 110 may include an organic light emitting diode (OLED), a plurality of TFTs that are connected to a corresponding data lines DL and a corresponding gate lines GL to control the OLED, and a storage capacitor.

The gate driver 120 outputs the scan signal to the gate lines by using a gate control signal GCS transferred from the timing controller 140. In the present specification, the scan signal refers to a signal that is transferred through a gate line and turns on switching transistors of pixels to allow the pixels to be charged with data voltages applied through data lines. Also, a signal for turning off the switching TFT is referred to as a gate-off signal. If the switching TFT is an N type, the scan signal is a high-level voltage, and the gate-off signal is a low-level voltage. On the other hand, if the switching TFT is a P type, the scan signal is a low-level voltage, and the gate-off signal may be a high-level voltage. A generic name for the scan signal and the gate-off signal is a gate signal.

The gate driver 120 includes a shift register including a plurality of stages and is configured as a gate-in panel (GIP) type where output terminals of the stages are electrically connected to gate lines arranged in the display area A/A. The shift register of the gate driver 120 may be disposed on one side of the panel 110, or as illustrated in FIG. 1, may be disposed on both sides of the panel 110. In this case, a shift register disposed on one side may apply the scan signal to pixels provided in one area of the panel 110, and another shift register disposed on the other side may apply the scan signal to pixels provided in the other area of the panel 110. For example, the gate drivers 120 may be configured as an interlace type where stages of a shift register disposed on one side apply the scan signal to pixels corresponding to odd-numbered gate lines, and stages of another shift register disposed on the other side apply the scan signal to pixels corresponding to even-numbered gate lines.

The data driver 130 converts digital image data, transferred from the timing controller 140, into analog data voltages by using a reference voltage and supplies the analog data voltages for one horizontal line to the data lines at every one horizontal period where the scan signal is supplied to a corresponding gate line. The data driver 130 may be connected to the panel 110 in a chip-on film (COF) type, may be directly equipped in the panel 110, or may be configured as thin film transistors (TFTs) in the panel 110.

The timing controller 140 transfers a data control signal DCS for controlling the data driver 130 and a gate control signal GCS for controlling the gate driver 120 and transfers image data to the data driver 130. Also, the timing controller 140 may supply a clock CLK for driving the gate driver 120. The gate driver 120 or data driver 130 may be provided as one IC along with the timing controller 140.

The gate control signal GCS may include a gate start pulse GSP, a gate shift clock GSC, a gate output enable signal GOE, a gate clock GCLK, etc. The data control signal DCS may include a source start pulse SSP, a source shift clock signal SSC, a source output enable signal SOE, etc. If a touch sensing function is added to the panel 110, a touch control signal for controlling the touch driver 150 may also be transferred from the timing controller 140.

As described above, the display device 100 according to the present invention may include a touch sensing function. If the display device 100 includes the touch sensing function, a plurality of touch electrodes are included in the panel 110, and the display device 100 includes a touch driver 150 that supplies a touch voltage to the touch electrodes to determine whether there is a touch. If the display device 100 does not include the touch sensing function, the touch electrodes and the touch driver 150 may be omitted.

If the display device according to the present invention includes the touch sensing function, the display device 100 may determine whether the panel 110 is touched, in a touch sensing period, and in an image display period, the gate driver 120 may output the scan signal to operate the pixels of the panel 110.

In the present specification, for convenience of description, a panel to which an in-cell type is applied is described as an example of the embodiments. However, the present invention may be applied to a display device having an on-cell type, an add-on type, or a hybrid type as well as an in-cell type. In an in-cell type display device, touch electrodes for sensing a touch are directly included in the panel 110. For example, a common electrode of the panel 110 may be used as a touch electrode. An in-cell type touch panel may be configured based on a self-capacitance type or a mutual-capacitance type.

Figure 2A:
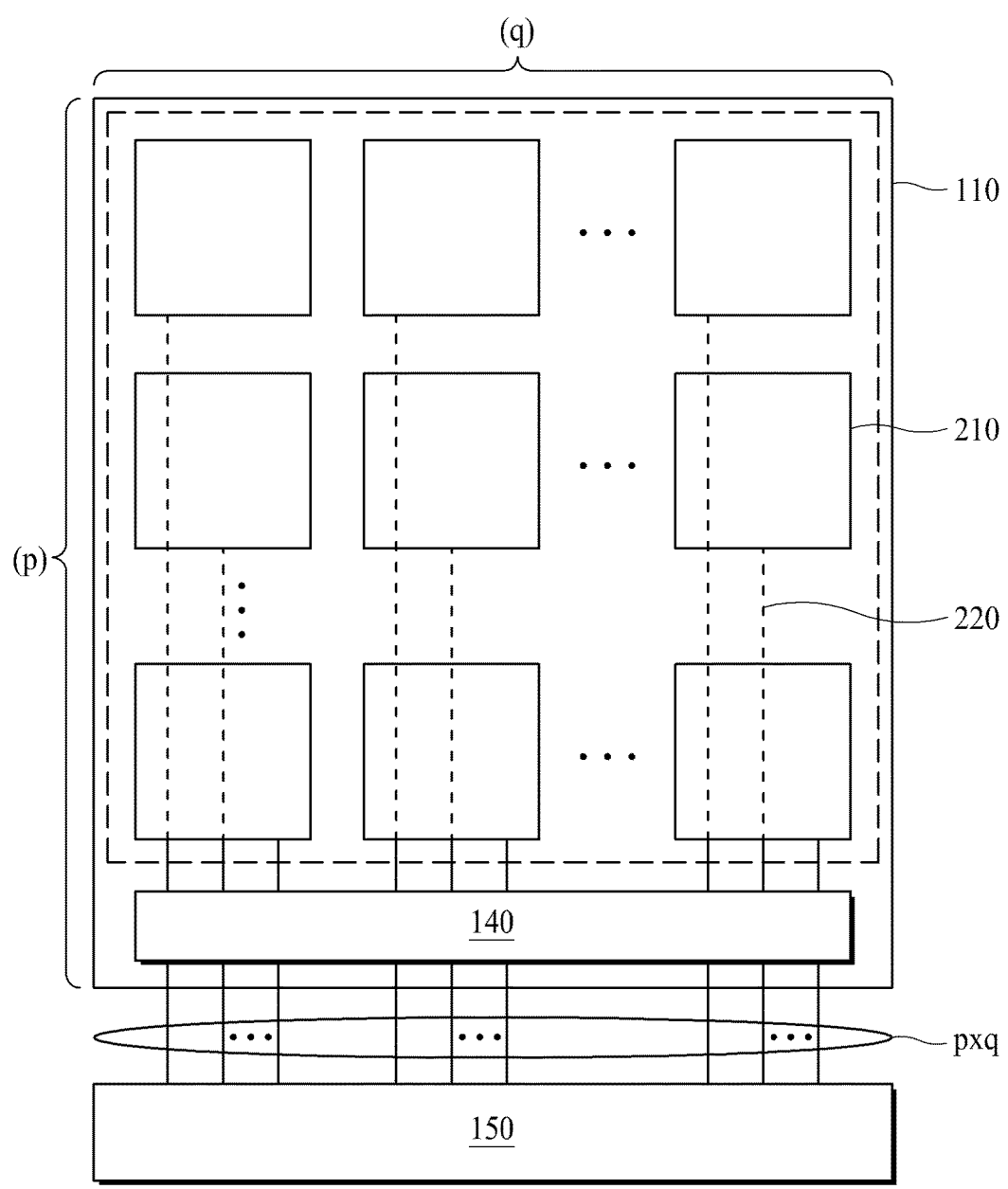
FIG. 2A is a plan view illustrating an example of a display device including a touch sensing function according to the present invention.

FIG. 2A is a plan view illustrating an example of a display device including a touch sensing function.

If the panel 110 of the display device 100 is configured as a liquid crystal panel, a plurality of common electrodes 210 for generating an electric field along with pixel electrodes to drive liquid crystal may be configured as a block. In the image display period, voltages for generating electric fields along with voltages supplied to the pixel electrodes to drive the liquid crystal are supplied to the common electrodes 210. On the other hand, in the touch sensing period, a voltage for allowing the touch sensing function to be performed is supplied to each of the common electrodes 210 through a touch signal line 220. In this case, the common electrodes 210 acts as touch electrodes.

The number of touch electrode lines (TL1 to TL(p×q)) 220 may correspond to a multiplication of the number "q" of touch electrodes 210 which are disposed in a horizontal direction of the panel 110 and the number "p" of touch electrodes 210 which are disposed in a vertical direction of the panel 110. A plurality of the touch electrodes 210 may be respectively provided in a plurality of pixels provided in the panel 110. As illustrated in FIG. 2, each of the touch electrodes 210 may be connected to the touch driver 150 through a corresponding touch electrode line 220, and in this case, a self-capacitive touch sensing function may be performed.

In order to solve or address problems which occur because each of the touch electrode lines 220 are disposed far closer to a pixel electrode or a common electrode, the touch electrode lines 220 may be disposed inside a planarization layer that covers TFTs for driving the pixels. In an embodiment, the touch electrode lines 220 may be disposed under the TFTs, the pixel electrode and the common electrode may be disposed over a corresponding TFT, and the touch electrode lines 220 may be connected to the common electrodes 210 through a contact hole.

If each of the touch electrode lines 220 is disposed on a side opposite to the pixel electrode and the touch electrode with a layer, including the TFT, therebetween, the planarization layer may be disposed on and under the layer on which the TFT is provided. Here, the planarization layer which is formed before the TFTs are formed may be formed of a material for minimizing a defect caused by a process of forming the TFTs. In an embodiment, the touch electrode lines 220 may be formed on a substrate, the TFTs for driving the pixels may be formed on the touch electrode lines 220, and the planarization layer disposed between a layer on which the touch electrode lines 220 are arranged and a layer where the TFTs are arranged may be formed of silicon-based SOG.

Figure 2B:
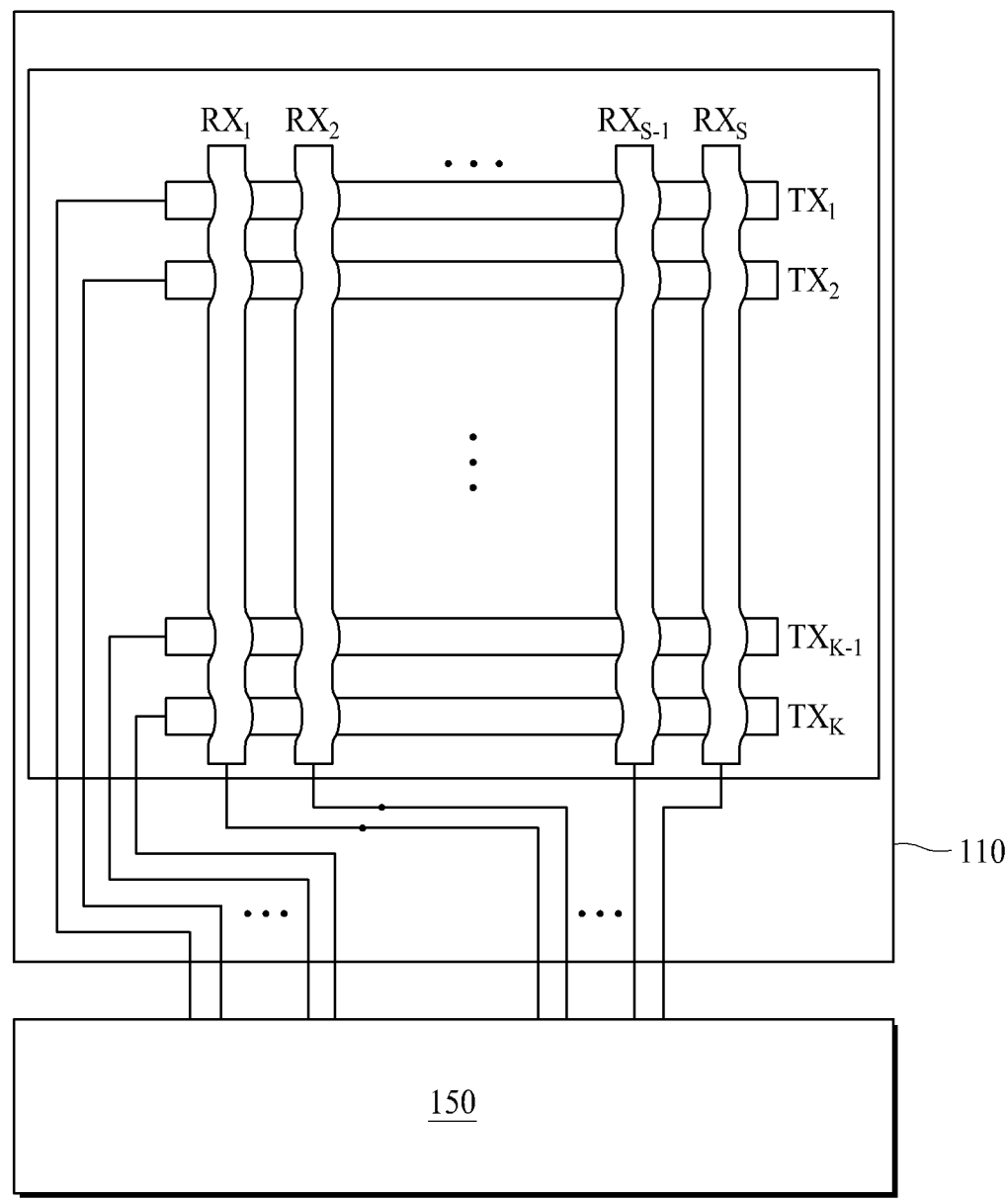
FIG. 2B is a plan view illustrating another example of a display device including a touch sensing function according to the present invention.

FIG. 2B is a plan view illustrating another example of a display device including a touch sensing function.

As illustrated in FIG. 2B, the panel 110 may include a plurality of driving electrodes TX1 to TXk and a plurality of receiving electrodes RX1 to RXs. In the image display period, the common voltage is supplied to the driving electrodes and the receiving electrodes, and thus, the panel 110 displays an image. In the touch sensing period, a touch voltage may be sequentially supplied to the driving electrodes, and the touch driver 150 may perform a mutual-capacitive touch sensing function based on sensing signals received from the receiving electrodes.

The touch driver 150 may be provided as a separate drive IC, or may be integrated into the timing controller 140 or the data driver 130.

Figure 3A:
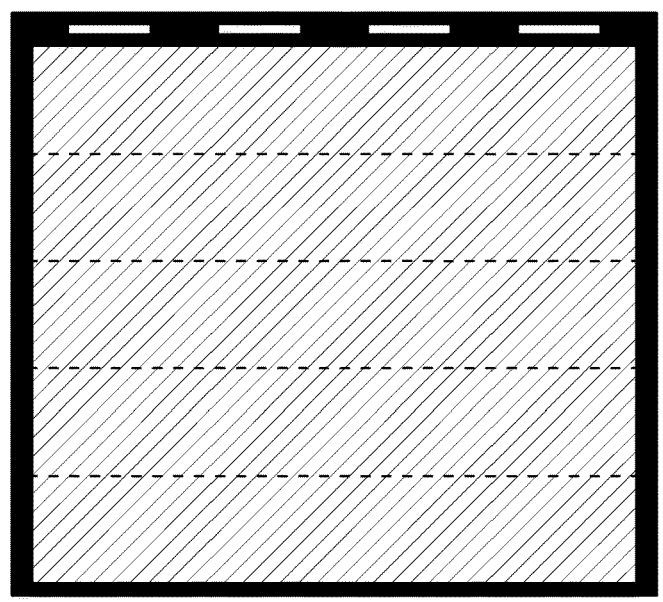
FIGS. 3A to 3C are various exemplary diagrams for describing a method of driving a display device according to the present invention.
Figure 3B:
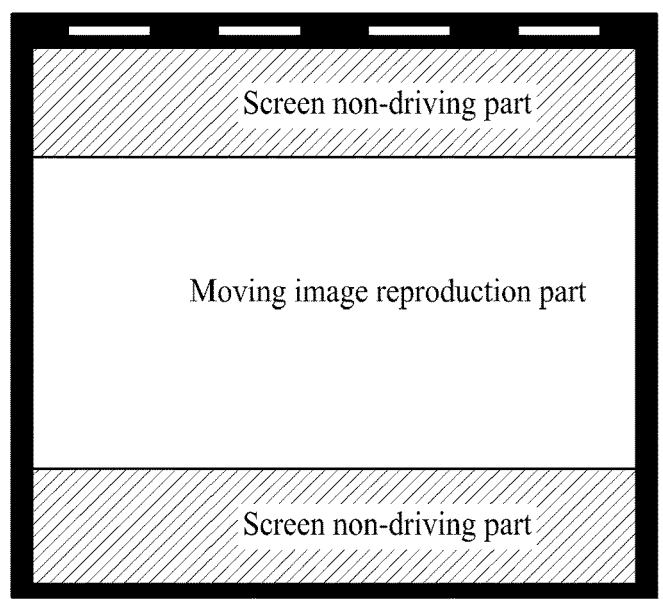
Figure 3C:
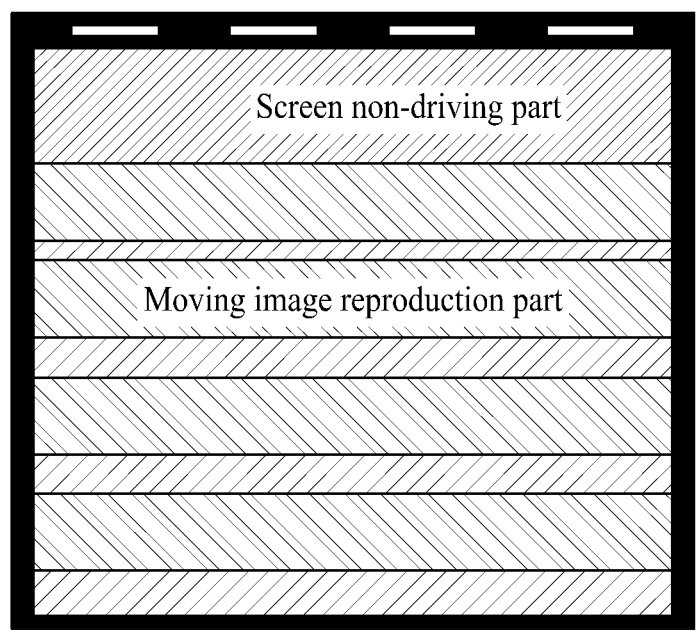

FIGS. 3A to 3C are various exemplary diagrams for describing a method of driving a display device according to the present invention.

In some embodiments of the present invention, by adjusting a timing when an enable signal is applied and a period where the enable signal is applied, an output of the scan signal to the gate lines is controlled in units of one frame. For example, the scan signal may be sequentially output to the gate lines in one frame period where the enable signal is not applied. Therefore, as illustrated in FIG. 3A, all pixels in the display area are charged with data voltages applied through the data lines to display an image. However, in one frame period where the enable signal is applied, the scan signal is not output to the gate lines, and thus, the pixels are not charged with new data voltages. That is, the display device according to some embodiments of the present invention may vary a driving speed of the panel 110 by using the enable signal. For example, the panel 110 may be driven at a relative fast speed of 60 FPS to 240 FPS, and then, the driving speed of the panel 110 may vary to a driving speed of 1 FPS to 30 FPS, based on an output image or a driving condition of the panel 110. According to the present invention, a period where data voltages are charged into the pixels may vary based on a change in the driving condition of the panel 110 or the output image, thereby decreasing power consumption in comparison with a conventional driving method where all pixels in the display area are charged with data voltages at the same period always.

Moreover, the display device according to some embodiments of the present invention may control an output of the scan signal to some gate lines in one frame period by using the enable signal. For example, as illustrated in FIGS. 3B and 3C, by adjusting a timing when the enable signal is applied and a period where the enable signal is applied in one frame period, the panel 110 may be divided into a display area including gate lines to which the scan signal is output and another driving area including other gate lines to which the scan signal is not output, and may be driven. According to the present invention, a period where data voltages are charged into pixels in one driving area may be adjusted to be shorter or longer than a period where data voltages are charged into pixels in another driving area, and thus, power consumption is reduced in comparison with a conventional driving method where data voltages are charged into all pixels in the display area at the same period always.

Moreover, according to some embodiments of the present invention, like a touch sensing operation, operations which are easily performed in a state where the scan signal is not output to the gate line may be performed according to the enable signal, based on a period where the scan signal is not output during one frame period. In the related art, in order to sense a touch in a period where there is no noise caused by the scan signal, the touch sensing operation is performed for a blank time between frames. On the other hand, in the present invention, due to the enable signal, a section where the scan signal is not output is generated a plurality of times in one frame period. In this case, since the touch sensing operation is performed a plurality of times during one frame period, a touch sensitivity is enhanced. In addition to an operation of sensing a touch, operations which are easily performed in a state where the scan signal is not output to the gate line may be performed a plurality of times during one frame period.

In the present invention, by using the enable signal, an output of the scan signal to the gate lines may be controlled by various methods. However, since stages connected to the respective gate lines are sequentially driven irrespective of whether the enable signal is input, a separate external signal for stopping and then again starting operations of specific stages is not needed. Accordingly, the number, positions, and sizes of driving areas into which the display area is divided may be freely changed.

Even when new data voltages are supplied through the data lines, pixels in a driving area where the scan signal is not output to the gate lines cannot operate with the new data voltages. Therefore, the display area may be divided and driven by controlling an output of the scan signal from each of the stages included in the gate driver 120. Accordingly, in some embodiments, the data driver 130 may output data voltages irrespective of whether the scan signal is output to gate lines arranged in a specific driving area.

In another embodiment, the timing controller 140 may transfer only image data, corresponding to driving areas to which the scan signal is supplied, to the data driver 130.

For example, in the present embodiment, data voltages may not be output to the data lines of the display device 100 until the scan signal is not output by the enable signal and then is again output. In this case, the timing controller 140 may control the data driver 130 according to a timing when the scan signal is again output, in order for the data voltages to be output to the data lines.

The timing controller 140 realigns input video data received from an external system according to a driving method of the gate driver 120 described herein to generate image data and transfers the image data to the data driver 130.

Figure 4:
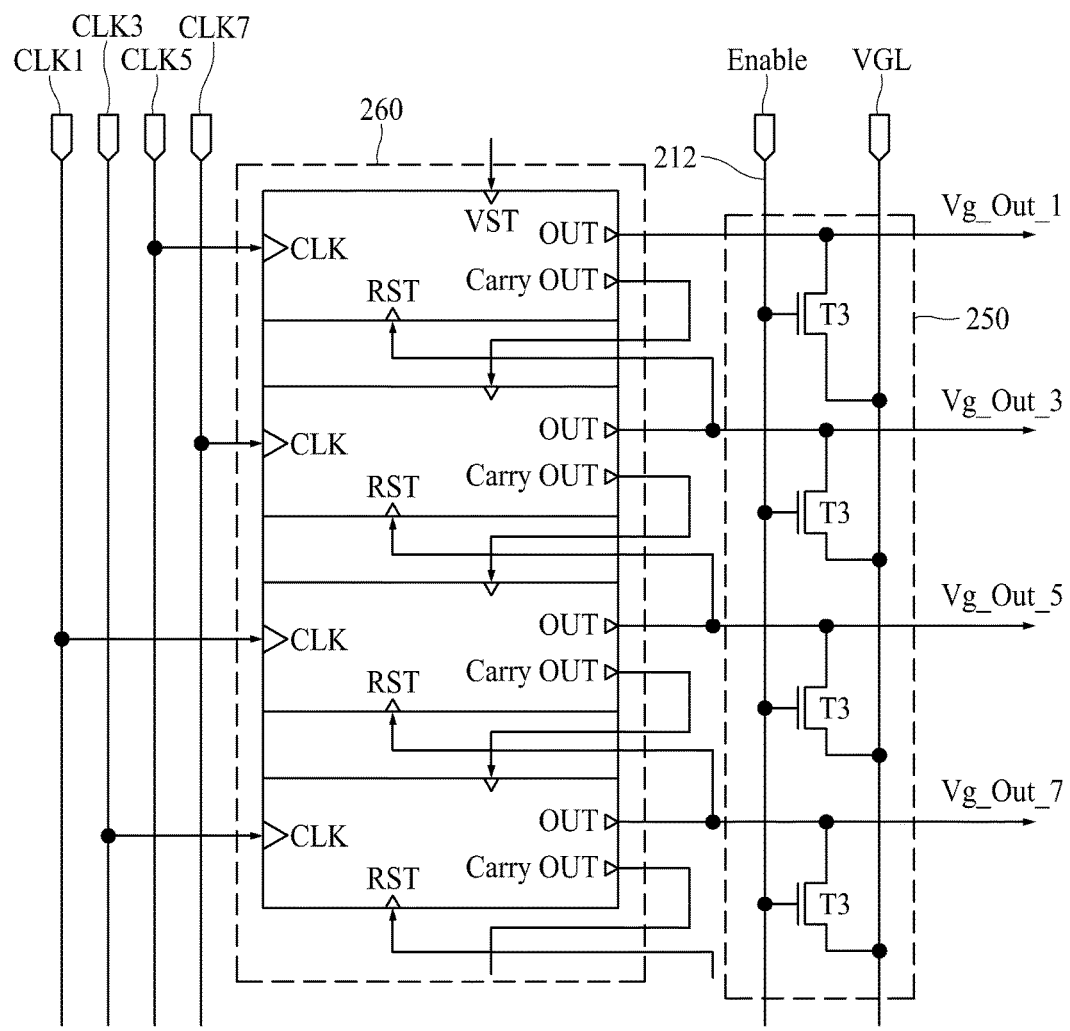
FIG. 4 is an exemplary diagram illustrating a configuration of a gate driver applied to a display device according to a first embodiment of the present invention.
Figure 5:
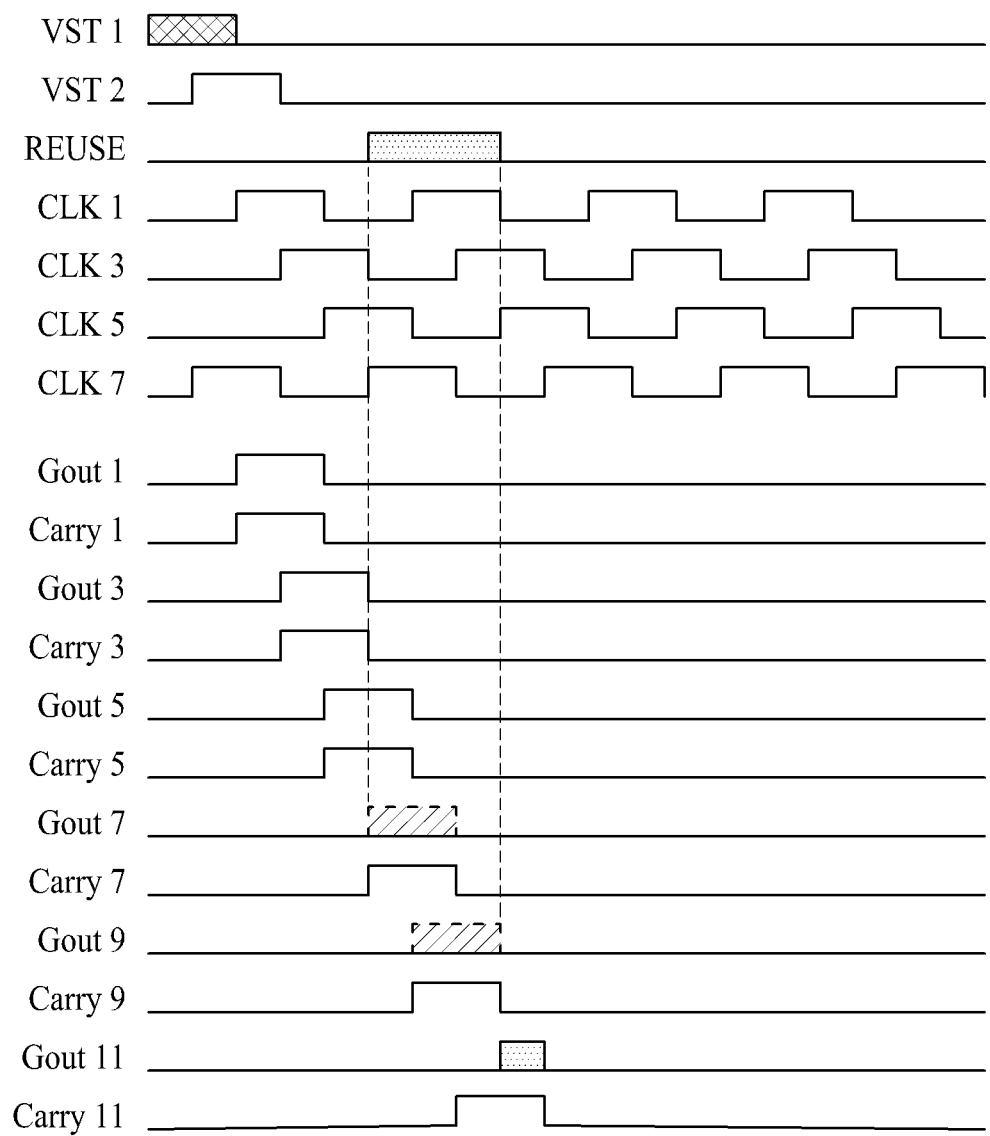
FIG. 5 is an exemplary diagram showing waveforms of signals applied to a display device according to the present invention.
Figure 6A:
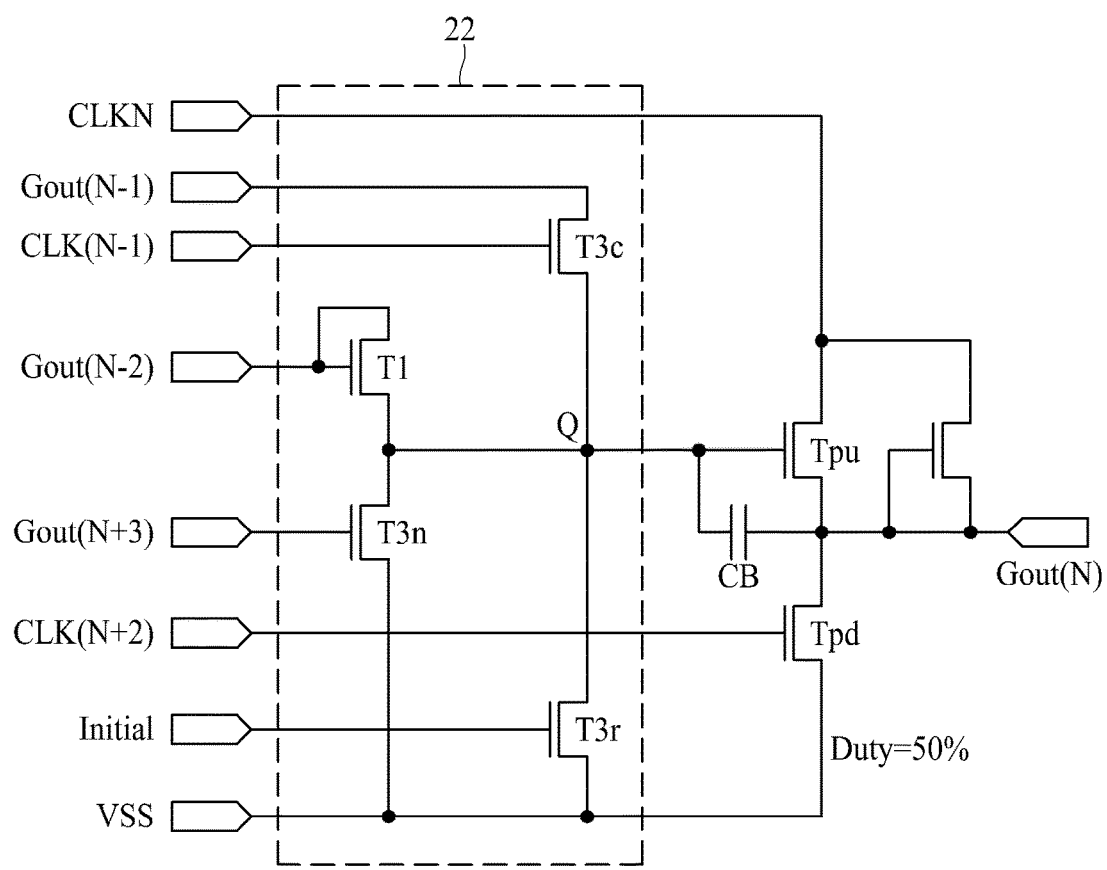
FIG. 6A is an exemplary diagram illustrating a simple logic circuit (SLC)-based stage according to the present invention.
Figure 6B:
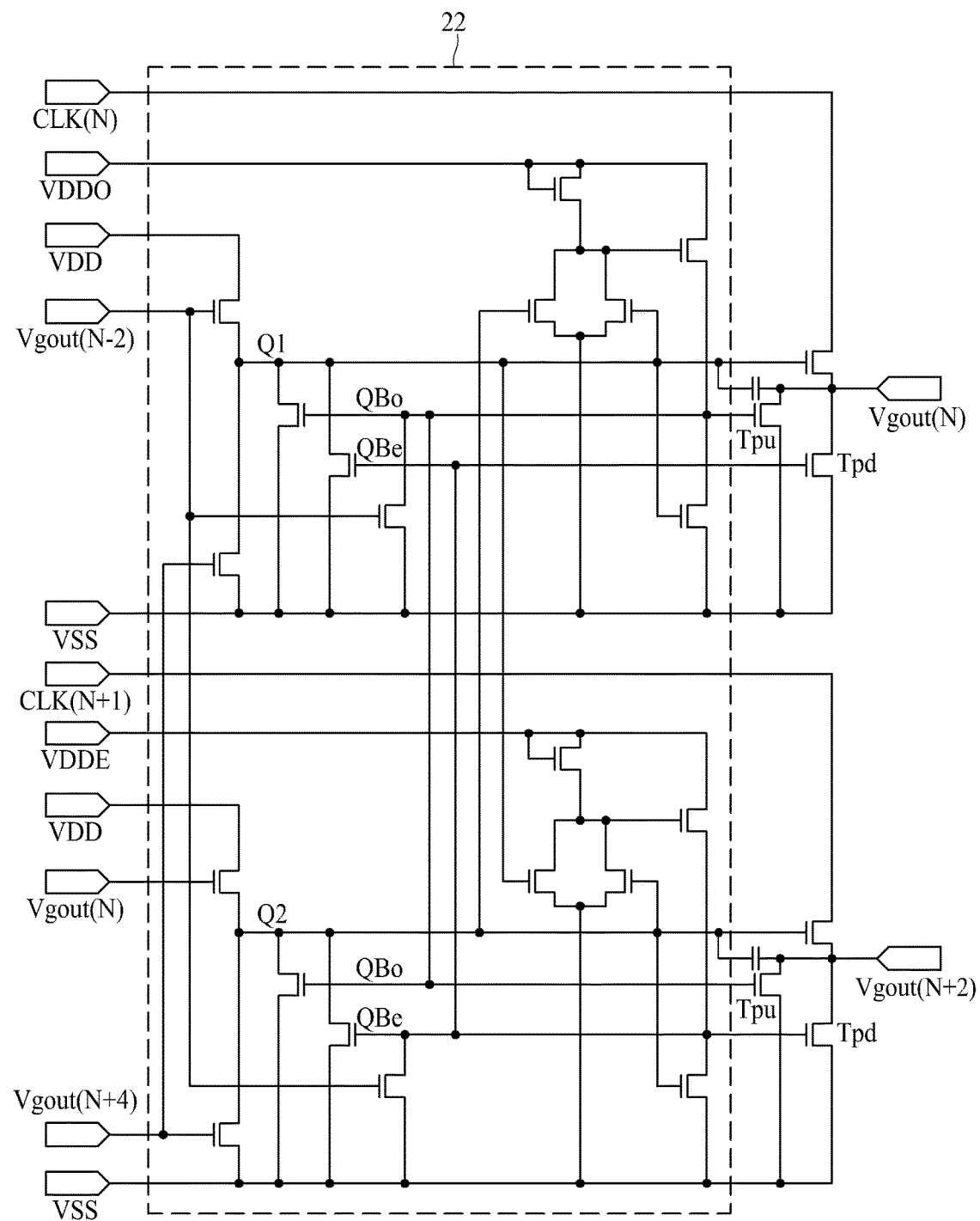
FIG. 6B is an exemplary diagram illustrating a half dual pull-down AC (HDAC)-based stage according to the present invention.

FIG. 4 is an exemplary diagram illustrating a configuration of a gate driver applied to a display device according to a first embodiment of the present invention, and FIG. 5 is an exemplary diagram showing waveforms of signals applied to a display device according to the present invention. FIG. 6A is an exemplary diagram illustrating a simple logic circuit (SLC)-based stage, and FIG. 6B is an exemplary diagram illustrating a half dual pull-down AC (HDAC)-based stage.

A gate driver 120 illustrated in FIG. 4 includes a shift register 260 including a plurality of stages that sequentially generate scan signals. A plurality of gate lines are connected to the stages of the shift register 260 and are supplied with the scan signals. The gate driver 120 includes a blocking unit 250 that discharges output terminals of the stages, connected to the gate lines, to a low-level VGL (or Ground) according to an enable signal applied through an enable signal line 212. In the first embodiment, the enable signal may discharge an output terminal of a stage, connected to a gate line, to a low-level voltage source VSS (Ground), and thus, an output of the scan signal supplied to the gate line may be controlled.

To provide an additional description, the blocking unit 250 includes a transistor T3 that is connected between the low-level voltage source VGL and the output of the stage connected to the gate line and includes a gate connected to the enable signal line 212. When the transistor T3 of the blocking unit 250 is turned on by the enable signal, the output terminal of the stage is discharged to the low-level voltage source VGL. Therefore, even when the stage outputs the scan signal to the output terminal, the scan signal is not applied to the gate line.

A first stage generates the scan signal and may output the scan signal to an output terminal of the first stage, and when the transistor T3 of the blocking unit 250 is turned off by the enable signal, the scan signal is output to the gate line. Subsequently, a second stage generates the scan signal and outputs the scan signal to an output terminal of the second stage, and when the transistor T3 of the blocking unit 250 is turned on by the enable signal, a voltage of the low-level voltage source VGL is output to the gate line without the scan signal being output to the gate line.

In FIG. 4, the blocking unit 250 that controls an output of the scan signal by using one enable signal is illustrated, but the number of enable signals is not limited. Therefore, in other embodiments, the blocking unit 250 may be driven by a plurality of enable signals supplied through a plurality of enable signal lines. When the blocking unit 250 operates according to the plurality of enable signals, a pre-charge time increases, and thus, characteristic of an output of a stage which again starts becomes better.

As shown in a timing diagram of FIG. 5, when a scan signal Gout3 of a first stage is output to an output terminal of the first stage and a scan signal Gout5 of a second stage is output to an output terminal of the second stage, an enable signal having a gate-off voltage is applied to the enable signal line 212. Therefore, the scan signals generated by the first and second stages are sequentially output to gate lines through the blocking unit 250. On the other hand, when a scan signal Gout7 of a fourth stage is output to an output terminal of the fourth stage and a scan signal Gout9 of a fifth stage is output to an output terminal of the fifth stage, an enable signal having a gate-on voltage is applied to the enable signal line 212. Therefore, gate lines connected to the fourth and fifth stages are discharged to the low-level voltage source VGL by the transistor T3 of the blocking unit 250. That is, in a period where the enable signal having the gate-off voltage is being applied, the transistor T3 of the blocking unit 250 is turned off, and thus, the scan signals generated from the stages are sequentially output to the gate lines. Accordingly, a driving area where pixels are charged with data voltages of data lines is generated.

However, in a period where the enable signal having the gate-on voltage is being applied, the transistor T3 of the blocking unit 250 is turned on, and thus, the scan signals generated from the stages is not output to the gate lines. Accordingly, a driving area where pixels are not charged with data voltages of data lines may be generated. Even when the scan signals which are generated from the stages according to the enable signal are not output to the gate lines, a carry signal generated from a stage may be transmitted to a next stage to sequentially operate stages subsequent thereto.

For example, as shown in FIG. 5, even when scan signals which are generated from stages according to the enable signal are not output to gate lines, each of the stages of the shift register 260 may output a carry signal to drive a next stage. Therefore, when a scan signal generated from a stage is not output to the gate lines, the stages of the shift register 260 may be sequentially driven.

The carry signal may be supplied to a next stage through a carry signal terminal (Carry OUT) of each of the stages. Also, each stage may include a plurality of pull-up/pull-down transistors for outputting the scan signal, and moreover, may further include a plurality of pull-up/pull-down transistors for outputting the carry signal.

Here, the shift register 260 includes two stages illustrated in FIG. 4 and a plurality of stages. Each of the stages may be connected to one gate line to output one scan signal, but is not limited thereto. In other embodiments, each of the stages may be connected to two gate lines to sequentially or simultaneously output two scan signals.

To provide an additional description, the stages described herein may be configured based on HDAC or SLC. For example, FIG. 6A illustrates an SLC-based stage, and FIG. 6B illustrates an HDAC-based stage.

First, the SLC-based stage will be briefly described below with reference to FIG. 6A. In the SLC-based stage, a separate QB-node is not provided. The QB-node is a node for controlling an output of the gate-off signal.

The SLC-based stage may be configured with, for example, seven TFTs and one capacitor CB. In the SLC-based stage, a layout is simplified, and an area of a bezel is reduced.

Particularly, due to the capacitor CB, a coupling voltage is reduced, a bootstrap voltage increases, and the voltage holding characteristic of a Q-node is enhanced. In the SLC-based stage using oxide, the capacitor CB may be provided for securing a margin of a threshold voltage (Vth), thereby enhancing reliability.

Next, the HDAC-based stage will be briefly described below with reference to FIG. 6B. The HDAC-based stage includes two QB-nodes, and moreover, may include two power sources for alternately driving the QB-nodes. In the HDAC-based stage, a pull-down TFT is repeatedly deteriorated and recovered, and thus, reliability of a circuit is enhanced.

Particularly, in the gate driver including the HDAC-based stages, two adjacent stages share the QB-nodes. Therefore, the number of TFTs and a size of a circuit are reduced.

In the HDAC-based stage, stability of the circuit is enhanced, and reliability of the circuit is enhanced.

In the HDAC-based stage, two adjacent stages may be implemented as one stage. For example, the stage illustrated in FIG. 6B substantially includes two stages. To provide an additional description, each of two stages configuring the stage of FIG. 6 includes two QB-nodes, and the two stages share the QB-nodes. Such a type of stage, as described above, is referred to as an HDAC-based stage.

TFTs configuring the gate driver 120 applied to the present invention described herein may each be implemented as an oxide TFT, for example, indium gallium zinc oxide (IGZO). However, the present invention is not limited thereto. Accordingly, a TFT applied to the present invention may be configured as an amorphous silicon (a-Si) TFT, or may be configured as a poly TFT through a low temperature poly silicon (LTPS) process.

Particularly, the oxide TFT is better in mobility characteristic of a current than the a-Si TFT, and thus, when the oxide TFT is applied, a size of a circuit is reduced.

Moreover, a leakage current of the oxide TFT is lower than that of each of the a-Si TFT and an LTPS TFT. Therefore, as in the display device 100 according to embodiments of the present invention or a gate driver that allows one driving area of the display area to be driven at a frame rate lower than that of another driving area, if the oxide TFT is applied to a gate driver that does not output a scan signal temporarily, the gate driver is more stably driven.

However, as described above, according to the present invention, in addition to the oxide TFT, the a-Si TFT or the LTPS TFT may be applied, and moreover, the a-Si TFT, the LTPS TFT, and the oxide TFT may be used together.

Figure 7:
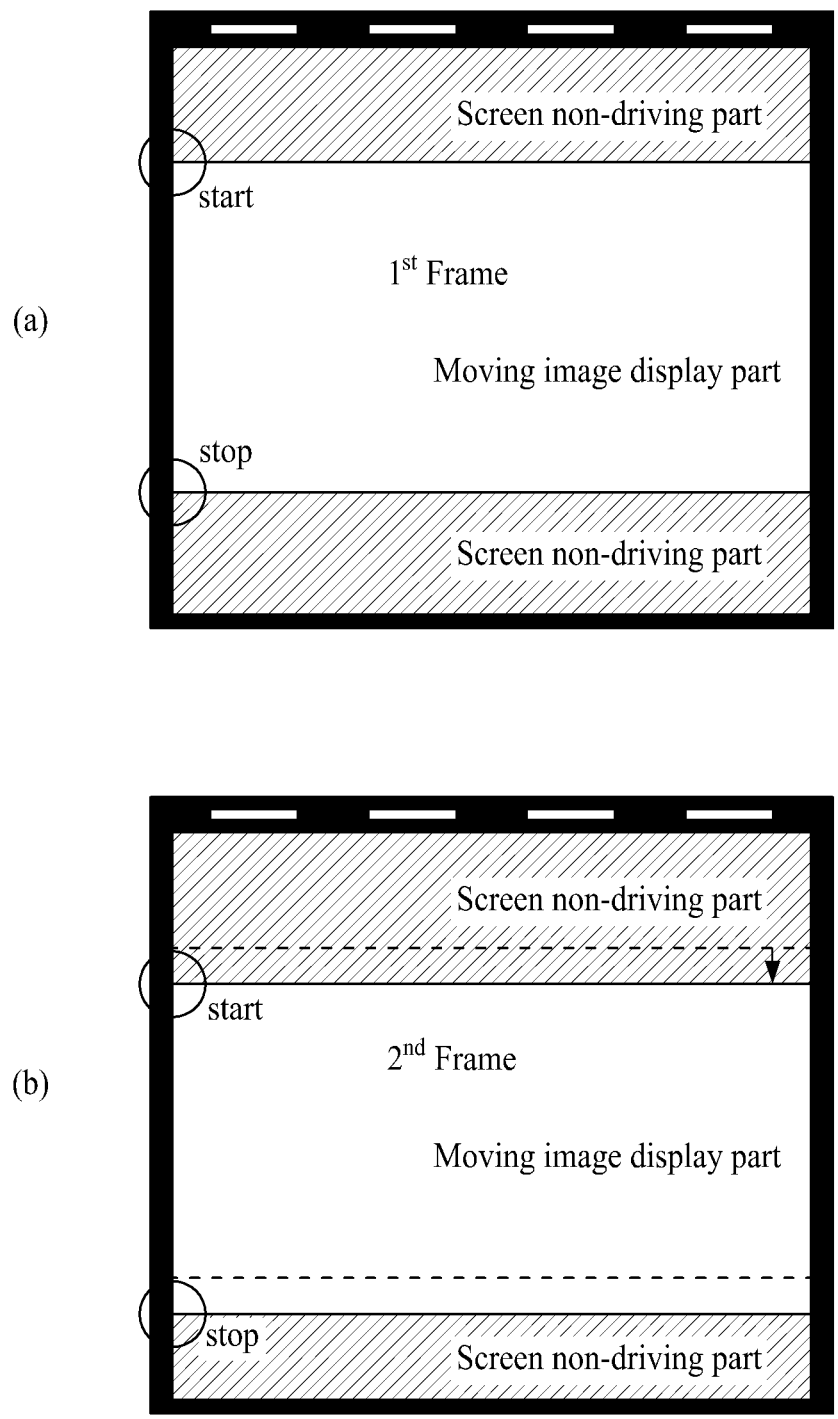
FIG. 7 is an exemplary diagram for describing a driving method in a display device according to the present invention.

FIG. 7 is an exemplary diagram for describing a driving method in a display device according to the present invention.

In the display device according to the present invention, in a case where a screen is divided and driven by using the enable signal, when an output of the same stage is restricted and an operation of outputting the scan signal from the same stage is repeated during several frames, deterioration of transistors of the stage is accelerated. Therefore, by adjusting a timing when the enable signal is applied, the display device according to the present invention may control the panel 110 to change a stage where an output of the scan signal is restricted. For example, an image may be displayed from a start position to a stop position illustrated in (a) of FIG. 7 in one frame period, and in two frame periods, as illustrated in (b) of FIG. 7, the start position and the stop position may move a little in a direction toward a lower end of the panel 110.

As described above, in the present invention, data voltages may be continuously output through the data lines irrespective of whether the scan signal is output to the gate lines.

Therefore, the start position may move from an upper end of the panel 110 to the lower end of the panel 110 via a position illustrated in (a) of FIG. 7 and a position illustrated in (b) of FIG. 7, thereby preventing deterioration of a specific stage. An operation, where a section where driving is temporarily stopped in a screen is frequently changed by adjusting a timing when an enable signal is applied and a period where the enable signal is applied, may be variously set based on characteristic of an element (a-Si, Oxide, or LTPS) configuring a TFT backplane.

Figure 8:
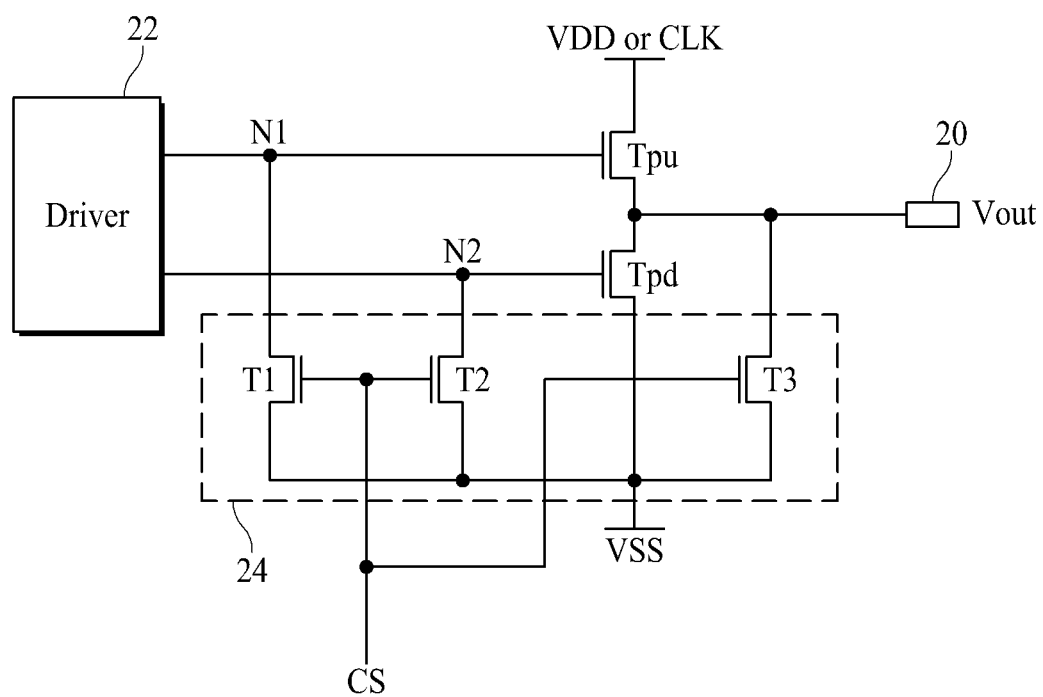
FIG. 8 is an exemplary diagram illustrating a configuration of a node controller applied to a display device according to the present invention.

FIG. 8 is an exemplary diagram illustrating a configuration of a node controller applied to a display device according to the present invention.

In the present invention, by using the driving method illustrated in FIG. 7, a problem where an element of a specific stage is deteriorated is solved.

Moreover, according to the present invention, by using the node controller illustrated in FIG. 8, each stage is stably driven.

For example, as described above, the gate driver 120 includes a plurality of stages, and each of the stages is configured with a plurality of TFTs. In this case, each of the stages should stably maintain a voltage of a gate line connected thereto. However, while the gate driver 120 is being driven, some nodes included in each stage may be in a floating state and can be affected by external noise, causing abnormal driving where a voltage of a corresponding gate line changes, and/or the like.

Moreover, a lifetime of each of the TFTs included in each stage is shortened due to a stress caused by residual electric charges remaining in nodes which is in the floating state. Particularly, in TFTs which use an oxide semiconductor, since an off current is very low, a very long time is taken until the residual electric charges are naturally discharged. For this reason, a time for which the stress caused by the residual electric charges is applied to a TFT using an oxide semiconductor increases.

Therefore, according to the present invention, as illustrated in FIG. 8, a node controller 24 may be added into each stage, and the node controller 24 controls a floating node to a specific stage and minimizes residual electric charges. Therefore, the gate driver 120 is more stably driven, and the lifetime and reliability of each of the transistors configuring the gate driver 120 increase. In this case, a driver 22 of FIG. 8 may perform a function of generating a signal for driving a pull-up transistor Tpu or a pull-down transistor Tpd, and for example, may include an area illustrated in FIGS. 6A and 6B.

According to the present invention, the gate driver may control the floating node to a specific state by using the node controller 24, and thus, a voltage of a gate line is stabilized irrespective of noise. Also, according to the present invention, a pull-up transistor and a pull-down transistor may be turned off for a certain time by using the node controller 24, thereby enhancing the lifetime and reliability of each of the TFTs. Also, according to the present invention, the node controller 24 may remove residual electric charges when the supply of power is stopped, thereby enhancing the lifetime of each of the TFTs.

Particularly, in various embodiments of the present invention, since the voltage of the gate line is stabilized by the node controller 24, the voltage of the gate line is stabilized even in a period where a data voltage is not output.

To provide an additional description, the node controller 24 to be described below may be applied to each stage applied to the present invention, and thus, even in a period where the scan signal is not output to the gate line, the voltage of the gate line is stabilized.

A control signal CS input to the node controller 24 may be input to the node controller 24 at various timings, based on a structure and a function of the stage.

First, referring to FIG. 8, a stage applied to the present invention includes a pull-up transistor Tpu, a pull-down transistor Tpd, a driver 22, and the node controller 24. The pull-up transistor Tpu is connected between a first signal line and an output terminal 20. Here, a clock CLK or a high-level voltage VDD may be supplied to the first signal line. A gate of the pull-up transistor Tpu is connected to a first node N1, namely, a Q-node. The pull-up transistor Tpu supplies the high-level voltage VDD to the output terminal 20 according to a voltage of the first node N1.

The pull-down transistor Tpd is connected between the output terminal 20 and a second signal line through which a low-level voltage VSS is supplied. Also, a gate of the pull-down transistor Tpd is connected to a second node N2, namely, a QB node. The pull-down transistor Tpd supplies the low-level voltage VSS to the output terminal 20 according to a voltage of the second node N2.

The driver 22 controls the voltage of each of the first and second nodes N1 and N2 according to signals supplied through one or more signal lines. The driver 22 may control the voltage of each of the first and second nodes N1 and N2 to alternately turn on or off the pull-up transistor Tpu and the pull-down transistor Tpd.

The node controller 24 controls the voltage of each of the first and second nodes N1 and N2 and a voltage at the output terminal 20 separately from the driver 22. For example, the node controller 24 may supply a certain voltage (for example, the low-level voltage VSS) to the first node N1, the second node N2, and the output terminal 20 according to a control signal CS.

When the low-level voltage VSS is supplied to the first node N1 and the second node N2, the pull-up transistor Tpu and the pull-down transistor Tpd may be set to a turn-off state. Also, when a voltage of a low-level voltage source is supplied to the output terminal 20, the output terminal 20 holds the low-level voltage VSS.

The node controller 24 includes first to third transistors T1 to T3.

The first transistor T1 is connected between a first node N1 and a low-level voltage source, and the second transistor T2 is connected between a second node N2 and the low-level voltage source. The third transistor T3 is connected between an output terminal 20 and the low-level voltage source. The first to third transistors T1 to T3 of the node controller 24 are turned on or off according to a control signal CS.

The control signal CS may be set to a low-level voltage VSS, a high-level voltage VDD, a voltage equal to or higher than the high-level voltage VDD, or a certain voltage between the low-level voltage VSS and the high-level voltage VDD.

To provide an additional description, the node controller 24 supplies the low-level voltage VSS to the first node N1 or the second node N2, which is maintained in a floating state, according to the control signal CS, thereby preventing an abnormal signal from being supplied to the first node N1 or the second node N2.

In the above-described present invention, by controlling an output of the scan signal to the gate lines, some nodes of each stage are floated for a longer time, and thus, deterioration of a transistor caused by residual electric charges is reduced.

Hereinabove, the node controller 24 has been described as being connected to the first node N1 connected to the pull-up transistor Tpu or the second node N2 connected to the pull-down transistor Tpd. However, the node controller 24 may be connected to nodes which are maintained in the floating state, in addition to the first node N1 and the second node N2 and may supply a specific voltage to a floated node. Accordingly, an abnormal signal is prevented from being supplied to a floated node among nodes configuring a stage, and thus, the voltage of the gate line is stably maintained.

To provide an additional description, the node controller 24 may be included in a stage applied to each embodiment of the present invention, and thus, the stage is stably driven.

Figure 9:
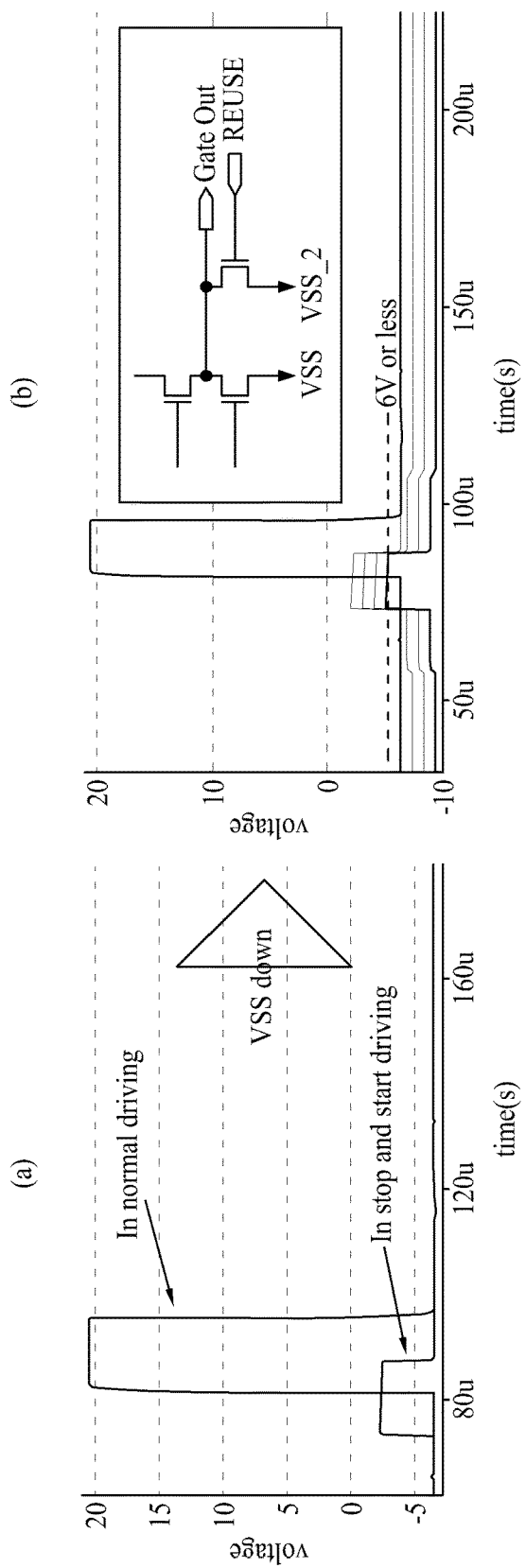
FIG. 9 is an exemplary diagram for describing a driving method for stably driving a display device according to the present invention.

FIG. 9 is an exemplary diagram for describing a driving method for stably driving a display device according to the present invention.

As a driving duration of the gate driver applied to the present invention increases, positive bias temperature stress (PBTS) increases, and thus, a threshold voltage "Vth" of a pull-down TFT is shifted.

In order to prevent the threshold voltage from being shifted, as illustrated in FIG. 9, a method of lowering a value of VSS_2 may be used.

To provide an additional description, FIG. 9 in (a) illustrates a scan signal which is being output in an abnormal form in a period where the scan signal is not output by an enable signal according to a threshold voltage of a pull-down transistor being shifted.

For example, in the present invention, the scan signal is not output in a period where the scan signal is not output by the enable signal. However, as illustrated in (a) of FIG. 9, when the threshold voltage of the pull-down transistor is shifted, an abnormal scan signal is output in the period.

In order to prevent such a problem, in the present invention, a voltage VSS_2 having a value lower than that of a voltage VSS which is output as the gate-off signal may be connected to an output terminal connected to a gate line. For example, in a period where the scan signal is not output by the enable signal, when a transistor connected to the output terminal is turned on, the voltage VSS_2 is output as the gate-off signal. Accordingly, in the period where the scan signal is not output by the enable signal, the abnormal scan signal is not output.

Figure 10:
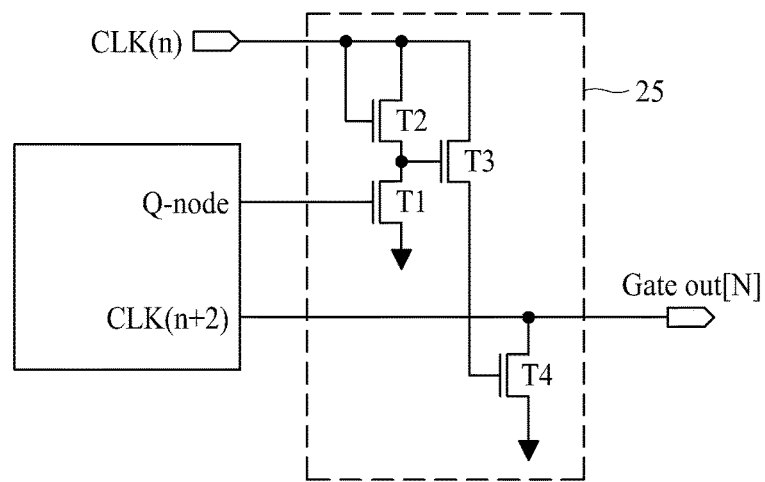
FIG. 10 is an exemplary diagram illustrating a configuration of a stabilization circuit for stably driving a display device according to the present invention.

FIG. 10 is an exemplary diagram illustrating a configuration of a stabilization circuit for stably driving a display device according to the present invention.

In order to stably drive the display device according to the present invention, a method illustrated in (b) of FIG. 9 may be applied, and a detailed method for executing the method illustrated in (b) of FIG. 9 is illustrated in FIG. 10.

In the present invention, when a scan signal is not output by an enable signal, an output terminal of a stage may be pulled down to a low level by the stabilization circuit 25 illustrated in FIG. 10, and thus, a gate-off signal having a low level is stably output.

For example, in a period where the scan signal is not output by the enable signal, a Q-node of the stage outputs a low signal, and the output terminal (gate out(N)) of the stage is output the gate-off signal having a low level.

In this case, a first transistor T1 having a gate connected to the Q-node is turned off. Also, the first transistor T1 is connected to a terminal to which a clock to be used as the scan signal in the stage is input, and a second transistor T2 having a gate connected to the terminal is turned on by the clock which is a high signal. Therefore, a third transistor T3 which is connected to the terminal and the output terminal and has a gate connected to a connection terminal between the first transistor T1 and the second transistor T2 is turned on. Accordingly, a fourth transistor T4 which is connected to the output terminal and a low-level voltage source and has a gate connected to the third transistor T3 is turned on, and thus, a voltage lower in level than the gate-off signal is output to a gate line.

Accordingly, an abnormal scan signal illustrated in (a) of FIG. 9 is not output in a period where the scan signal is not output by the enable signal, However, in a period where the scan signal is normally output, since the clock is discharged through the first transistor T1 and the second transistor T2, the fourth transistor T4 is turned off, and thus, a voltage lower in level than the gate-off signal is not output to the gate line.

Figure 11:
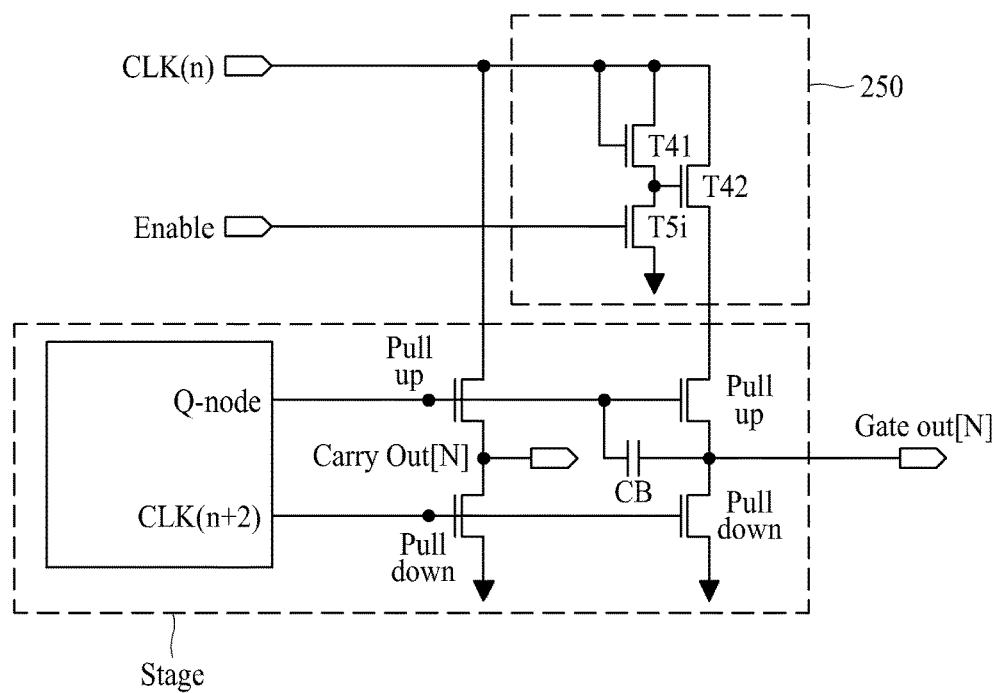
FIG. 11 is an exemplary diagram illustrating a gate driver having another structure applied to a display device of the present invention.

FIG. 11 is an exemplary diagram illustrating a gate driver 120 having another structure applied to a display device of the present invention.

In a structure illustrated in FIG. 11, the gate driver 120 includes a plurality of stages that sequentially generate scan signals, and as illustrated in FIG. 11, a blocking unit 250 is connected to each of the stages. At least one of a plurality of the blocking units 250 connected to the stages may block a scan signal output from a corresponding stage to a gate line according to an enable signal.

That is, in the gate driver 120, as illustrated in FIG. 11, one blocking unit 250 is individually connected to each stage that outputs one scan signal.

For example, as illustrated in FIG. 11, the blocking unit 250 includes a 42nd transistor T42 that is connected to a terminal receiving a clock CLK and the pull-up transistor of the stage, a 41st transistor T41 that is connected to the terminal receiving the clock CLK and a gate of the 42nd transistor T42 and is turned on/off by the clock CLK, and a 5ith transistor T5$i$ that is connected to a terminal or a ground (hereinafter simply referred to as a low-level voltage source) receiving a low-level voltage and the gate of the 42nd transistor T42 and is turned on/off by the enable signal.

In a case where the pull-up transistor of the stage illustrated in FIG. 11 is turned on and the clock CLK has a high level, when the enable signal is deactivated, the 5ith transistor T5$i$ is turned off, and the 41st transistor T41 and the 42nd transistor T42 are turned on, whereby the clock CLK is input to the pull-up transistor and is output to the gate line through the pull-up transistor. That is, the clock CLK is output as a scan signal to the gate line.

However, in a case where the pull-up transistor is turned on and the clock CLK has a high level, when the enable signal is activated, the 41st transistor T41 and the 5ith transistor T5$i$ is turned on. Therefore, the clock CLK is discharged to the low-level voltage source through the 41st transistor T41 and the 5ith transistor T5$i$. Therefore, the clock CLK is not output to the gate line through the pull-up transistor. That is, the scan signal is not output to the gate line.

As described above, whether to output the scan signal may be determined by controlling the enable signal in each stage.

To provide an additional description, in the structure illustrated in FIG. 11, unlike the structure described above with reference to FIG. 4, a method of controlling a clock supplied to a pull-up transistor of a stage to control an output of a scan signal is used instead of a method of pulling down an output of the scan signal from a stage. First, in a basic normal driving operation, the enable signal is deactivated to turn off the T5ith transistor T5$i$, and a high-level clock transferred through the T41st transistor T41 turns on the 42nd transistor T42. When the 42nd transistor T42 is turned on, the clock is transferred to the pull-up transistor through the 42nd transistor T42, and thus, a normal scan signal is output to the gate line through the output terminal. In a stop operation, the enable signal turns on the T5ith transistor T5$i$ to pull down the gate of the 42nd transistor T42 to a low level. Accordingly, the clock CLK is not output to the pull-up transistor through the 42nd transistor T42, and thus, the scan signal is not output to the gate line.

Figure 12:
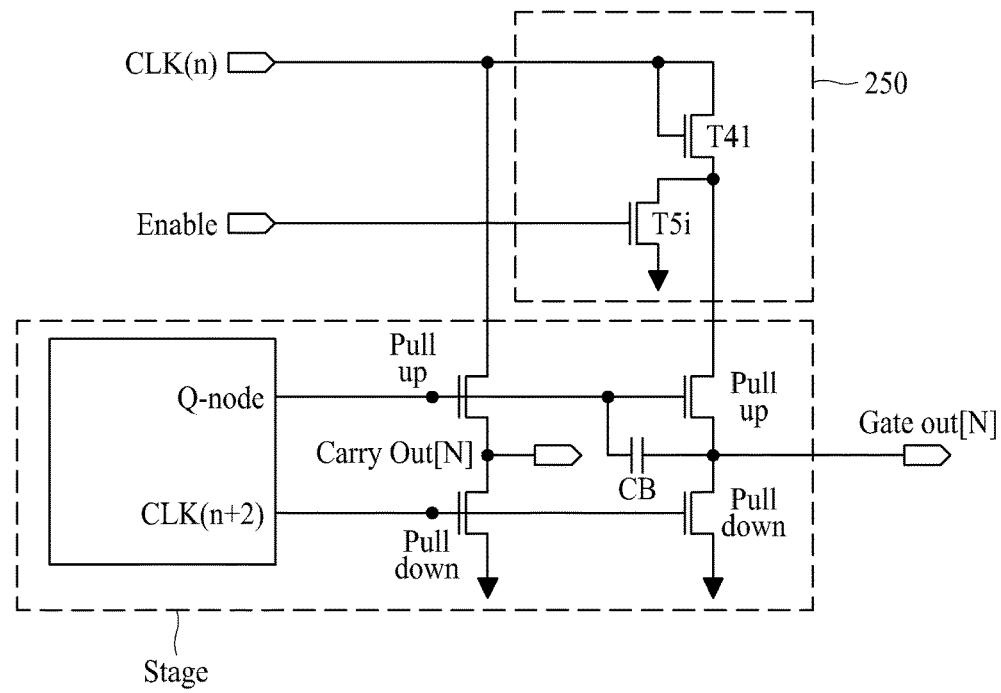
FIG. 12 is an exemplary diagram illustrating a gate driver having another structure applied to a display device of the present invention.

FIG. 12 is an exemplary diagram illustrating a gate driver 120 having another structure applied to a display device of the present invention.

In a structure illustrated in FIG. 12, the gate driver 120 includes a plurality of stages that sequentially generate scan signals, and a blocking unit 250 is connected to each of the stages. At least one of a plurality of the blocking units 250 blocks a scan signal output from a corresponding stage to a gate line according to an enable signal.

A basic structure of the gate driver 120 illustrated in FIG. 12 is similar to the basic structure of the gate driver described above with reference to FIG. 11. That is, as illustrated in FIG. 12, one blocking unit 250 is individually connected to each stage that outputs one scan signal. However, a blocking unit 250 having a structure different from a structure according to the preceding embodiment is provided.

For example, as illustrated in FIG. 12, the blocking unit 250 includes a 41st transistor T41, which is connected to a terminal receiving a clock CLK and the pull-up transistor of the stage and is turned on/off by the clock CLK, and a 5ith transistor T5i that is connected to a low-level voltage source receiving a low-level voltage and the pull-up transistor of the stage and is turned on/off by the enable signal.

In a case where the pull-up transistor of the stage illustrated in FIG. 12 is turned on and the clock CLK has a high level, when the enable signal is deactivated, the 5ith transistor T5i is turned off, and the 41st transistor T41 is turned on, whereby the clock CLK is input to the pull-up transistor and is output to the gate line through the pull-up transistor. That is, the clock CLK is output as a scan signal to the gate line.

However, in a case where the pull-up transistor is turned on and the clock CLK has a high level, when the enable signal is activated, the 41st transistor T41 and the 5ith transistor T5i is turned on. Therefore, the clock CLK is discharged through the 41st transistor T41 and the 5ith transistor T5i. Therefore, the clock CLK is not output to the gate line through the pull-up transistor. That is, the scan signal is not output to the gate line.

As described above, whether to output the scan signal may be determined by controlling the enable signal in each stage.

To provide an additional description, the gate driver illustrated in FIG. 12 has a structure similar to a case where the 42nd transistor T42 is removed from the structure of FIG. 11 and the 41st transistor T41 is directly connected to the pull-up transistor. The gate driver illustrated in FIG. 12 shifts the clock, input through the 41st transistor T41, to a low level by using the enable signal like the gate driver of FIG. 11, for performing a stop and start operation. Accordingly, the clock is not output to the gate line through the pull-up transistor (TFT).

Figure 13:
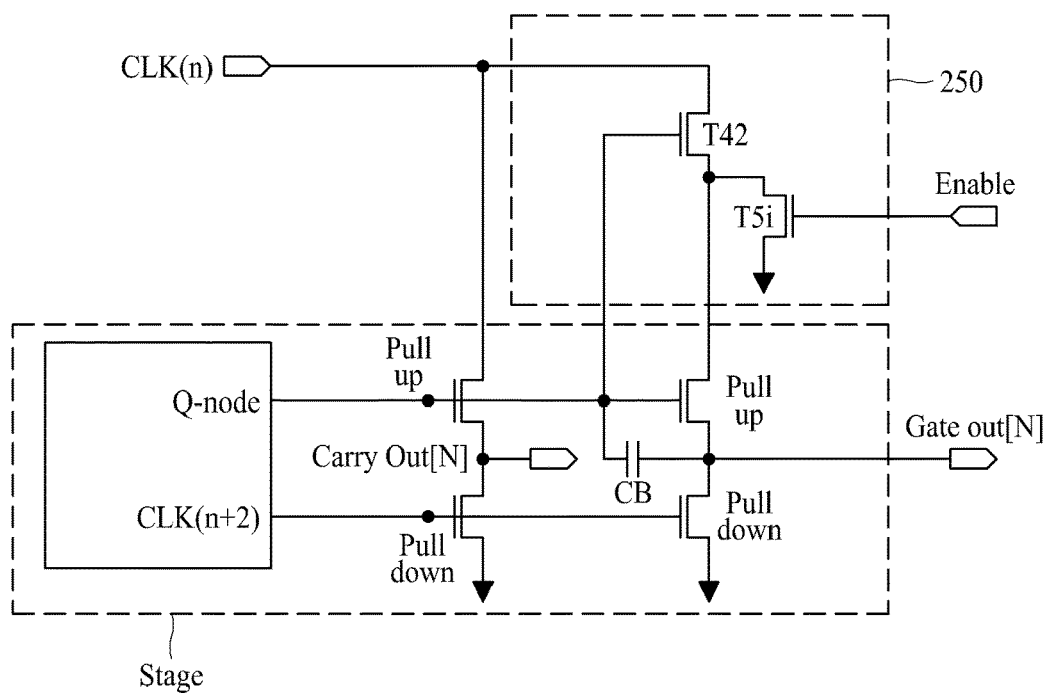
FIG. 13 is an exemplary diagram illustrating a gate driver having another structure applied to a display device of the present invention.

FIG. 13 is an exemplary diagram illustrating a gate driver 120 having another structure applied to a display device of the present invention.

In the present embodiment, as illustrated in FIG. 13, the gate driver 120 includes a plurality of stages that sequentially generate scan signals, and a blocking unit 250 is connected to each of the stages. At least one of a plurality of the blocking units 250 may block a scan signal output from a corresponding stage to a gate line according to an enable signal.

A basic structure of the gate driver 120 is similar to the basic structure of the gate driver applied described above with reference to FIGS. 11 and 12. That is, as illustrated in FIG. 13, one blocking unit 250 is individually connected to each stage that outputs one scan signal.

For example, as illustrated in FIG. 13, the blocking unit 250 includes a 42nd transistor T42, which is connected to a terminal receiving a clock CLK and the pull-up transistor of the stage and includes a gate connected to a gate of the pull-up transistor, and a 5ith transistor T5i that is connected to a low-level voltage source receiving a low-level voltage and the pull-up transistor of the stage and is turned on/off by the enable signal.

In a case where the pull-up transistor of the stage illustrated in FIG. 13 is turned on and the clock CLK has a high level, when the enable signal is deactivated, the 5ith transistor T5i is turned off, and the 42nd transistor T42 is turned on, whereby the clock CLK is input to the pull-up transistor and is output to the gate line through the pull-up transistor. That is, the clock CLK is output as a scan signal to the gate line.

However, in a case where the pull-up transistor is turned on and the clock CLK has a high level, when the enable signal is activated, the 42nd transistor T42 is turned on. Therefore, the clock CLK is discharged to a low-level voltage source through the 42nd transistor T42 and the 5ith transistor T5i. Therefore, the clock CLK is not output to the gate line through the pull-up transistor. That is, the scan signal is not output to the gate line.

To provide an additional description, in the gate driver 120 illustrated in FIG. 13, the gate of the 42nd transistor T42 is connected to a Q-node of the stage. Therefore, in a normal screen driving operation, if a voltage of the Q-node is a high-level voltage, the clock having a high level is output to the gate line through the pull-up transistor (or TFT), and if the voltage of the Q-node is a low-level voltage, the 42nd transistor T42 is turned off, and thus, the clock is not output to the gate line. Also, in the gate driver 120 illustrated in FIG. 13, in a stop and start operation, the enable signal is shifted to a high level, and thus, the 5ith transistor T5i is turned on, whereby the clock passing through the 42nd transistor T42 is discharged to the low-level voltage source. Accordingly, the scan signal is not output to the gate line, and thus, an output of the scan signal to the gate line is restricted.

In the structures of the gate driver 120 illustrated in FIGS. 11 to 13, a gate line which is floated in a stop operation based on the enable signal is stabilized by the stabilization circuit 24 described above with reference to FIG. 8.

Figure 14:
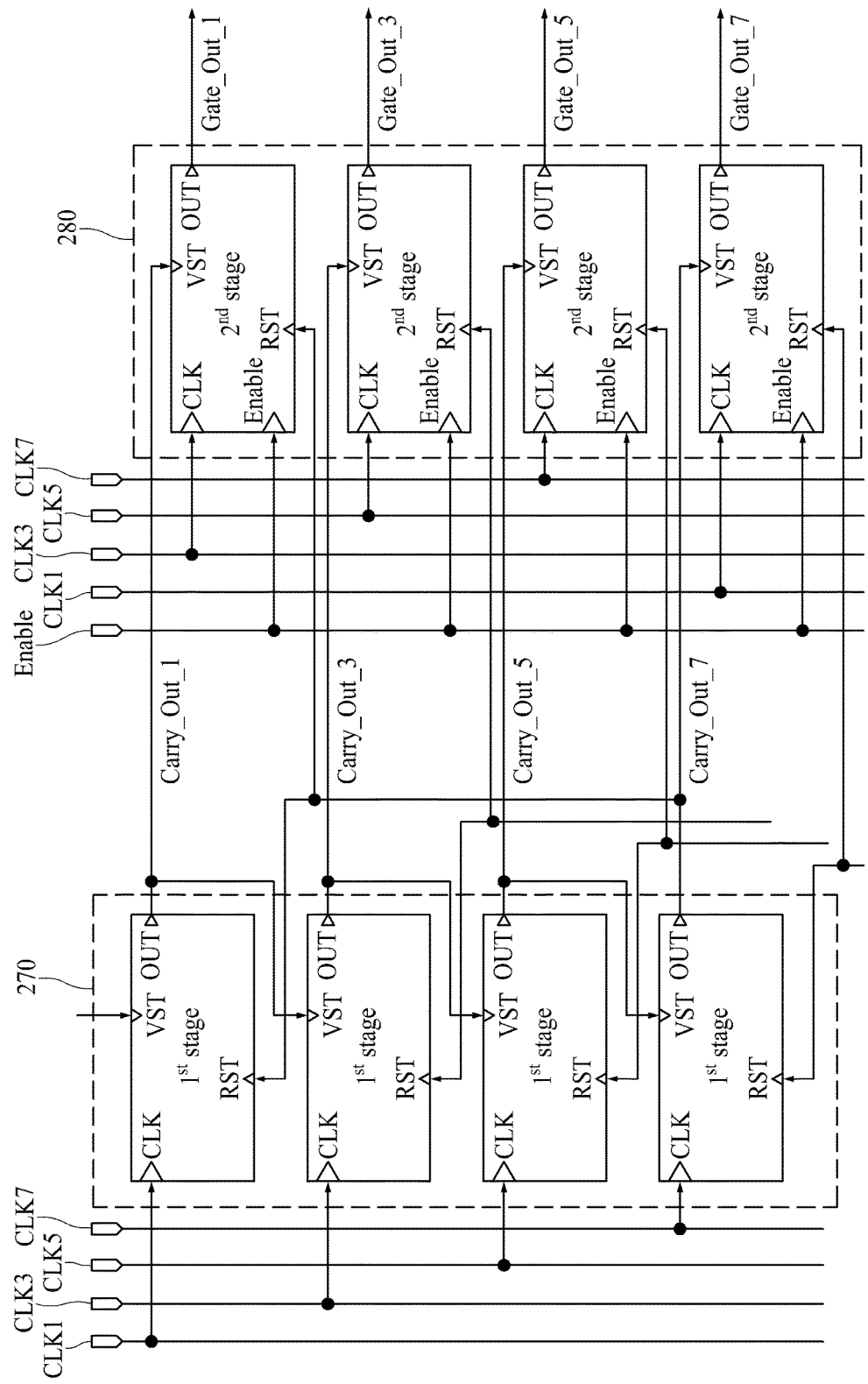
FIG. 14 is an exemplary diagram illustrating a gate driver having another structure applied to a display device of the present invention.

FIG. 14 is an exemplary diagram illustrating a gate driver 120 having another structure applied to a display device of the present invention, and FIGS. 15 to 18 are diagrams illustrating various configurations of a stage configuring the gate driver illustrated in FIG. 14.

As illustrated in FIG. 14, the gate driver 120 includes a first shift register 270, including a plurality of carry stages (1st stage) which sequentially generate a plurality of carry signals Carry_Out_1 to Carry_Out_7, and a second shift register 280 including a plurality of scan stages (2nd stage) which sequentially output a plurality of scan signals Gate-_Out_1 to Gate_Out_7 to gate lines according to the carry signals. At least one of the scan stages included in the second shift register 280 blocks an output of a scan signal to a gate line according to an enable signal.

For example, the carry stages (1st stage) provided on the left in FIG. 14 configure the first shift register 270, and the scan stages (2nd stage) provided on the right in FIG. 14 configure the second shift register 280.

The carry stages included in the first shift register 270 sequentially output the carry signals Carry_Out_1 to Carry_Out_7.

The carry signal is input as a start signal to the scan stage. The scan stage is driven by the carry signal and finally outputs the scan signal to the gate line. The carry signal is input a start signal to another carry stage included in the shift register 270.

When the carry signal and the enable signal are input to the other scan stage, the other scan stage does not output the scan signal to the gate line.

That is, the scan stages configuring the second shift register 280 may be driven by the carry signal, but may not output the scan signal to the gate line according to the enable signal.

To provide an additional description, unlike the preceding embodiments, in the present embodiment, the gate driver 120 has a dual shift register structure including two shift registers 270 and 280 which include a plurality of stages.

Carry stages and scan stages applied to the dual shift register structure may be configured based on SLC described above with reference to FIG. 6A, but may be configured as HDAC described above with reference to FIG. 6B without being limited thereto.

Detailed configurations of the carry stages and the scan stages applied to the dual shift register structure are illustrated in FIGS. 15 to 18.

In the dual shift register structure, each stage may be configured in a dual pull down GIP structure, configured based on SLC, or configured based on no ripple SLC (N-SLC) from which unstable ripple is removed. In an SLC-based dual shift register structure, in order to perform a stop and start operation, as illustrated in FIGS. 15 to 18, stages from which a T3c (noise cleaner) circuit included in an SLC-based stage is removed should be used, and the enable signal should be input to a scan stage.

Figure 15:
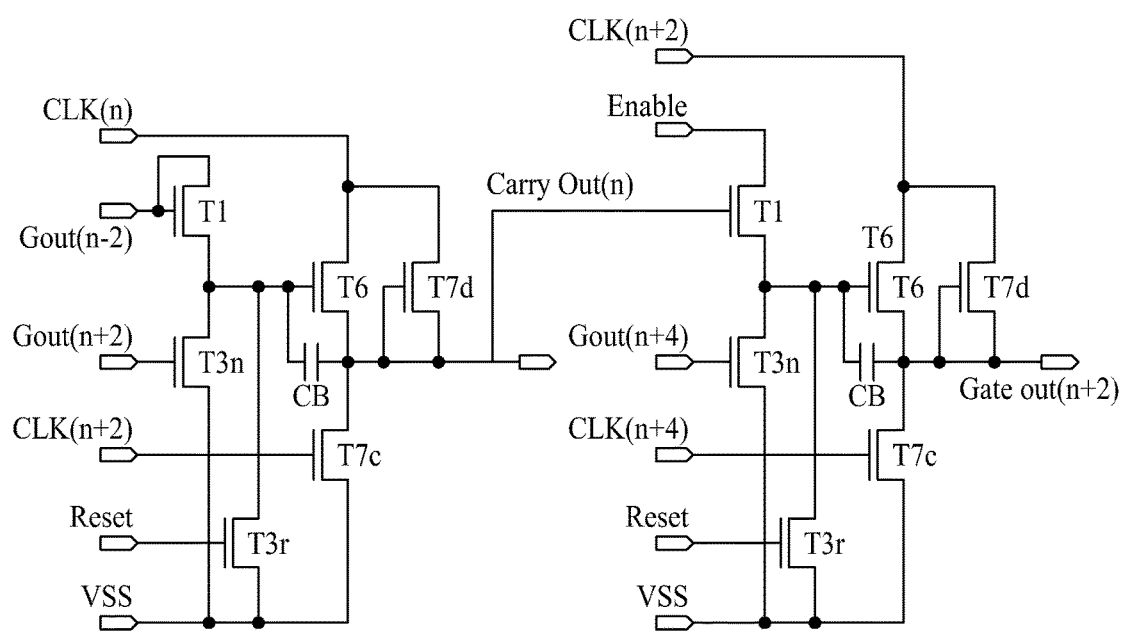
FIGS. 15 to 18 are diagrams illustrating various configurations of a stage configuring the gate driver illustrated in FIG. 14.

For example, as illustrated in FIG. 15, a carry signal (Carry Out(n)) of a carry stage is input to a scan stage to operate the scan stage. In this case, a scan stage where the enable signal is connected to a source of a transistor T1 used as a pre-charge TFT in a conventional SLC-based stage controls an output of a scan signal from the scan stage according to the enable signal to perform the stop and scan operation.

Particularly, unlike the preceding embodiments, in the present embodiment, if the enable signal is a low signal, the stop and start operation is performed, and if the enable signal is a high signal, a normal operation where the scan signal is output is performed. For example, in FIG. 15, in a case where the enable signal is a high signal, when a first transistor T1 is turned on by the carry signal (Carry Out(n)), the enable signal is transferred through the first transistor T1, and thus, a pull-up transistor T6 is turned on. Therefore, the scan stage may output the scan signal to a gate line. However, in a case where the enable signal is a low signal, even when the first transistor T1 is turned on by the carry signal, the pull-up transistor T6 is turned off, and thus, the scan signal is not output to the scan stage.

Figure 16:
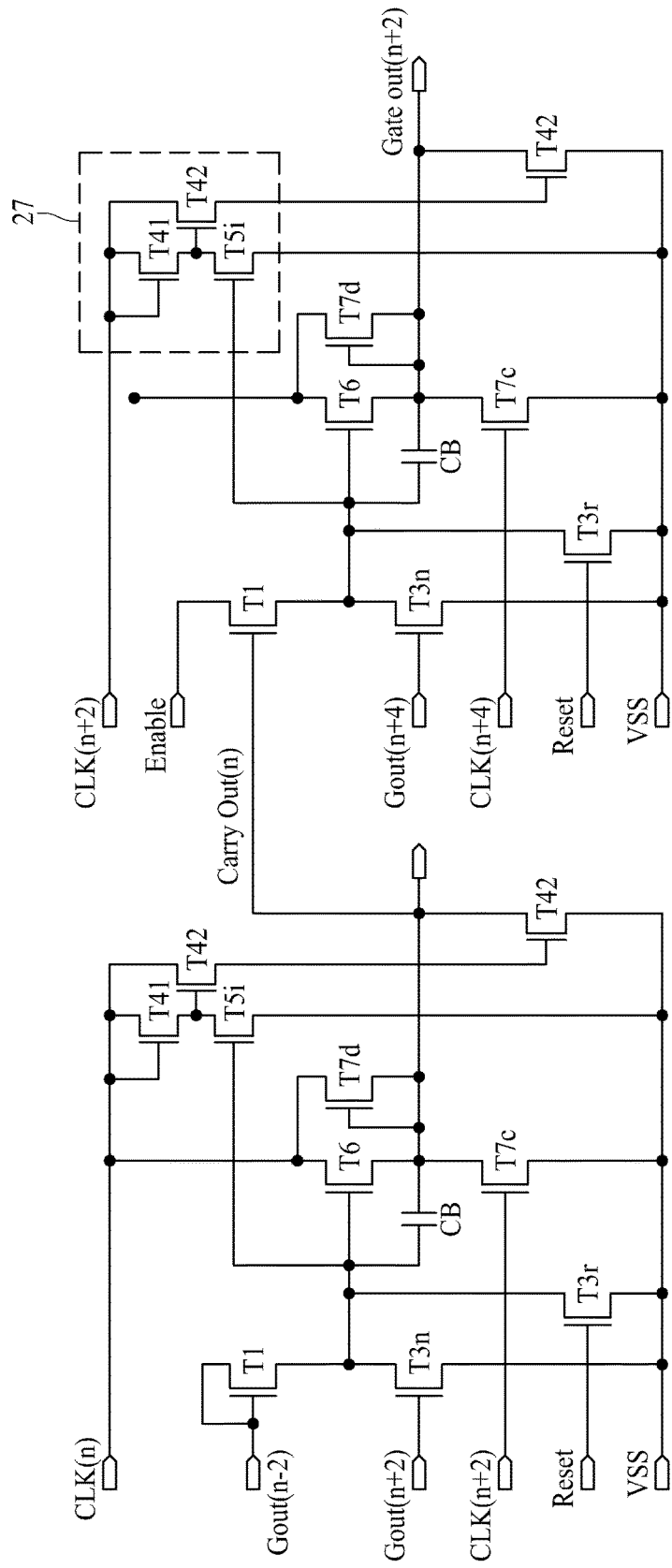

Moreover, a carry stage and a scan stage illustrated in FIG. 16 are driven in a method similar to the method described above with reference to FIG. 15. In comparison with the scan stage illustrated in FIG. 15, the scan stage illustrated in FIG. 16 further includes a noise cleaner circuit 27.

When the enable signal having a low level is input to the scan stage of FIG. 16 to turn off a pull-up transistor T6, a scan signal is not output to the scan stage. At this time, a transistor T5i is turned off, and thus, a clock is transferred to a transistor T7n through a transistor T42. The clock is a signal which is input in order to be used as a scan signal of the scan stage, and thus, when a carry signal is input, the clock has a high level. Therefore, the transistor T7n is turned on by the clock, and thus, a low-level voltage VSS is supplied to an output terminal of the scan stage.

Therefore, when an output of the scan signal is restricted by the enable signal, the low-level voltage VSS is supplied to the output terminal of the scan stage, and thus, an abnormal scan signal is not output to the gate line.

To provide an additional description, in a case where the noise cleaner circuit 27 is not provided, when an output of the scan signal is restricted by the enable signal, the output terminal of the scan stage is floated, and for this reason, noise occurs. However, the low-level voltage VSS is supplied to the output terminal by the noise cleaner circuit 27, and thus, noise is not output through the gate line.

Figure 17:
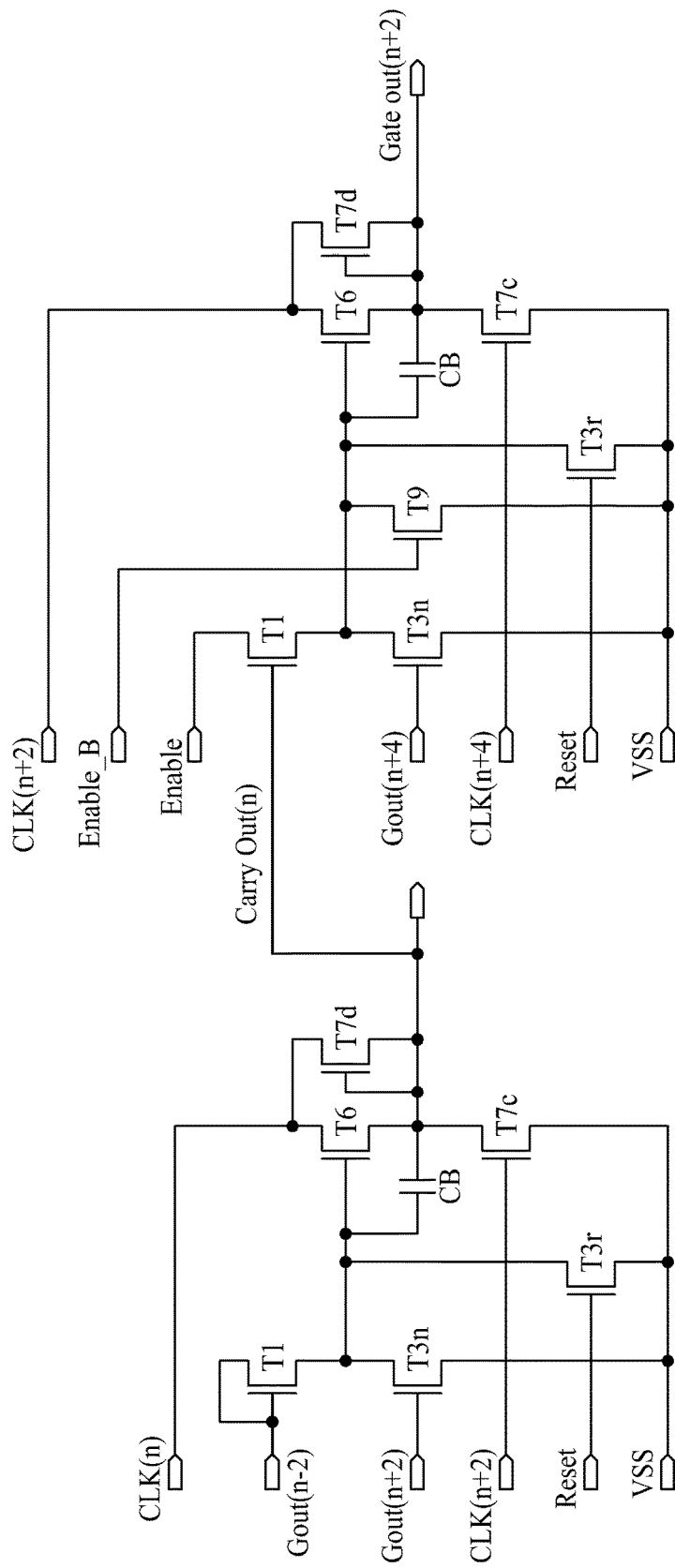

Moreover, a carry stage and a scan stage illustrated in FIG. 17 are driven in a method similar to the method described above with reference to FIG. 15. In comparison with the scan stage illustrated in FIG. 15, the scan stage illustrated in FIG. 17 further includes a stabilization transistor T9. An inversion signal Enable_B having a polarity opposite to that of the enable signal is input to the stabilization transistor T9. The stabilization transistor T9 is referred to as a node control transistor.

A basic structure and a driving method of each of the carry stage and the scan stage illustrated in FIG. 17 is the same as those of each of the carry stage and the scan stage described above with reference to FIG. 15.

However, in a gate driver illustrated in FIG. 17, in addition to the enable signal for a stop and start operation, the inversion signal Enable_B is additionally used for preventing clock coupling. The stabilization transistor T9 is turned on or off according to the inversion signal, and thus, a Q-node is stabilized in the stop and start operation.

For example, when the enable signal having a low level is input to the scan stage of FIG. 17 to turn off a pull-up transistor T6, a scan signal is not output to the scan stage.

At this time, the stabilization transistor T9 is turned on by the inversion signal having a high level, and thus, the low-level voltage VSS is supplied to a gate (i.e., a Q-node) of a pull-up transistor T6.

That is, when an output of the scan signal is forcibly blocked by the enable signal, the low-level voltage VSS is supplied to the Q-node and an output terminal of the scan stage, and thus, the pull-up transistor T6 is certainly turned off, whereby an abnormal scan signal is not output to a gate line. Also, by discharging residual electric charges remaining in nodes, deterioration of transistors is delayed.

When the scan signal is not forcibly blocked, the enable signal has a high level, and the inversion signal has a low level. Therefore, the stabilization transistor T9 is turned off, and thus, the enable signal having a high level is normally supplied to the Q-node, thereby turning on the pull-up transistor T6.

Figure 18:
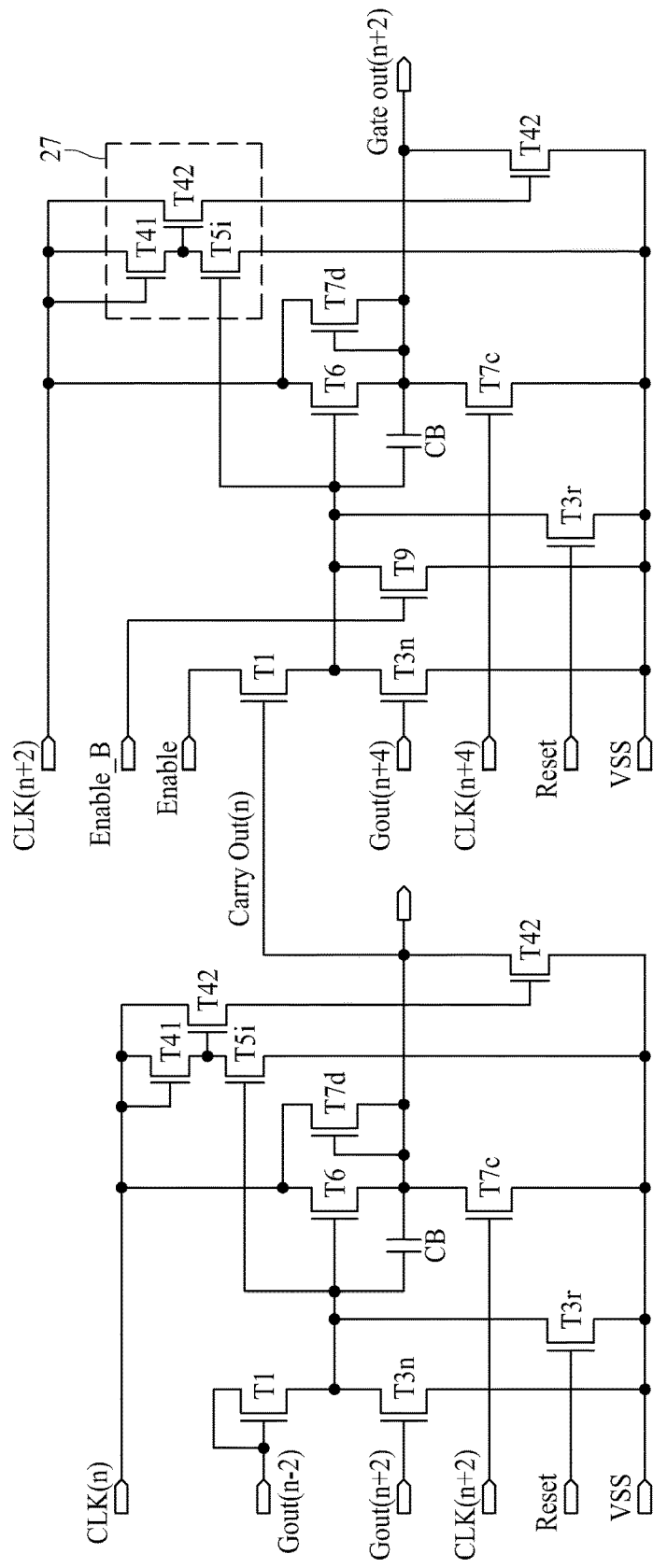

Moreover, a carry stage and a scan stage illustrated in FIG. 18 are driven in a method similar to the method described above with reference to FIG. 17. In comparison with the scan stage illustrated in FIG. 17, the scan stage illustrated in FIG. 18 further includes a noise cleaner circuit 27 which is as described above with reference to FIG. 16.

When the enable signal having a low level is input to the scan stage of FIG. 18 to turn off a pull-up transistor T6, a scan signal is not output to the scan stage.

In this case, a low-level voltage VSS is supplied to an output terminal of the scan stage by the noise cleaner circuit 27, and thus, an abnormal scan signal is not output to a gate line. Also, since the inversion signal having a high level is input to the stabilization transistor T9, the stabilization transistor T9 is turned on, and thus, the low-level voltage VSS is supplied to a gate of the pull-up transistor T6, whereby the pull-up transistor 6 is turned off.

To provide an additional description, in the scan stage illustrated in FIG. 18, when the scan signal is forcibly blocked by the enable signal, the pull-up transistor T6 is certainly turned off by the low-level voltage VSS, and thus, an output of the scan signal is primarily prevented. Also, since the low-level voltage VSS is supplied to the output terminal of the scan stage by the noise cleaner circuit 27, an abnormal scan signal is not output to a gate line.

Those skilled in the art can understand that the present invention can be embodied in another detailed form without changing the technical spirit or the essential features. Therefore, it should be understood that the embodiments described above are exemplary from every aspect and are not restrictive. It should be construed that the scope of the present invention is defined by the below-described claims instead of the detailed description, and the meanings and scope of the claims and all variations or modified forms inferred from their equivalent concepts are included in the scope of the present invention.

The invention claimed is:

1. A display device comprising:
a panel including a plurality of gate lines and a plurality of data line arranged therein;
a data driver supplying data voltages to the plurality of data lines arranged in the panel; and
a gate driver including a plurality of stages sequentially driven according to a start signal,
wherein the gate driver controls an output of a scan signal from at least one of the plurality of stages according to an enable signal,
wherein:
at least one of the plurality of stages comprises a node controller, and
the node controller supplies a voltage, which turns off a transistor connected to a node which is floated in the at least one stage, to the floated node,
wherein the node controller comprises a node control transistor connected between the low-level voltage source and the node which is floated in the at least one stage, and turned on or off according to a node control signal,
wherein the node control transistor is connected to a gate electrode of a pull-up transistor or a gate electrode of a pull-down transistor, and
wherein the node controller further comprises another node control transistor connected between the pull-up and pull-down transistors and the low-level voltage source.

2. The display device of claim 1, wherein the enable signal allows an output terminal of at least one of the plurality of stages to be discharged to a low-level voltage source.

3. The display device of claim 1, wherein the gate driver comprises a blocking unit including a transistor turned on or off according to enable signal, and the transistor is connected between a low-level voltage source and an output terminal of at least one of the plurality of stages.

4. The display device of claim 1, wherein the enable signal is supplied to at least one of the plurality of stages and allows a clock signal used as the scan signal to be discharged to a low-level voltage source.

5. The display device of claim 1, wherein the gate driver comprises a blocking unit, the blocking unit comprising:

a first transistor connected to a pull-up transistor and a terminal receiving a clock signal which is supplied to at least one of the plurality of stages and is used as the scan signal;
a second transistor connected to the terminal receiving the clock signal and a gate of the first transistor and turned on or off by the clock signal; and
a third transistor connected to a low-level voltage source and the gate of the first transistor and turned on or off according to the enable signal.

6. The display device of claim 1, wherein the gate driver comprises a blocking unit, the blocking unit comprising:
a first transistor connected to a pull-up transistor and a terminal receiving a clock signal which is supplied to at least one of the plurality of stages and is used as the scan signal, and turned on or off the clock signal; and
a second transistor connected to a low-level voltage source and the pull-up transistor and turned on or off according to the enable signal.

7. The display device of claim 1, wherein the gate driver comprises a blocking unit, the blocking unit comprising:
a first transistor connected to a pull-up transistor and a terminal receiving a clock signal which is supplied to at least one of the plurality of stages and is used as the scan signal, the first transistor including a gate connected to a gate of the pull-up transistor; and
a second transistor connected to a low-level voltage source and the pull-up transistor and turned on or off according to the enable signal.

8. The display device of claim 1, wherein:
the plurality of stages comprise a plurality of carry stages sequentially generating carry signals and a plurality of scan stages sequentially driven according to the carry signals, and
at least one of the plurality of scan stages controls an output of the scan signal according to the enable signal.

9. The display device of claim 8, wherein each of the plurality of scan stages comprises:
a pull-up transistor outputting a clock signal as the scan signal according to a voltage of a Q-node; and
a transistor connected between the Q-node and a terminal receiving the enable signal and turned on or off according to a corresponding carry signal to charge the Q-node with the enable signal.

10. The display device of claim 9, wherein each of the plurality of scan stages comprises a stabilizer supplying a low-level voltage to the output terminal when the enable signal has a voltage level for turning off the pull-up transistor.

11. The display device of claim 10, wherein the stabilizer comprises:
a first transistor connected between the output terminal and a low-level voltage source supplying the low-level voltage;
a second transistor connected between a terminal receiving the clock signal and a gate of the first transistor;
a third transistor connected between the terminal receiving the clock signal and a gate of the second transistor, the third transistor including a gate connected to the terminal receiving the clock signal; and
a fourth transistor connected between the gate of the second transistor and the low-level voltage source, the fourth transistor including a gate connected to the Q-node.

12. The display device of claim 1, wherein the gate driver comprises a plurality of stages excluding a QB-node.

13. The display device of claim 1, wherein the gate driver is configured so that two adjacent stages share a QB-node.

14. The display device of claim 1, further comprising:
a touch driver determining whether the panel is touched during both a touch sensing period of one frame and an image display period of the one frame for a portion of the panel corresponding a gate line that has been blocked from receiving the scan signal according to the enable signal.

15. A method of driving a display device including a gate driver, the method comprising:
outputting a scan signal to a gate line connected to at least one of a plurality of stages included in the gate driver according to an enable signal applied to the gate driver in one frame period;
stopping an output of the scan signal to the gate line connected to the at least one of the plurality of stages according to the enable signal in the one frame period; and
discharging a residual electric charge of a floating node included in a stage which does not output the scan signal,
wherein the stopping the output of the scan signal includes controlling the scan signal not to be output to the gate line by turning off a pull-up transistor connected to the gate line by the enable signal.

16. The method of claim 15, wherein the stopping the output of the scan signal includes controlling the scan signal not to be output to the gate line by discharging the output terminal of the stage connected to the gate line to a low-level voltage source by the enable signal.

17. The method of claim 15, wherein the stopping the output of the scan signal includes controlling the scan signal not to be output to the gate line by discharging a clock signal which is used as the scan signal at the stage connected to the gate line to a low-level voltage source by the enable signal.

18. The method of claim 15, further comprising:
determining whether there is a touch during both a touch sensing period of one frame and an image display period of the one frame for a portion of the panel corresponding a gate line that has been blocked from receiving the scan signal according to the enable signal.

19. The method of claim 15, further comprising:
supplying a low-level voltage to an output terminal of a stage which does not output the scan signal according to the enable signal, based on a clock signal which is to be used as the scan signal for the stage and a voltage of a Q-node of the stage.

* * * * *